US006753586B1

(12) United States Patent
Holcombe

(10) Patent No.: US 6,753,586 B1
(45) Date of Patent: Jun. 22, 2004

(54) DISTRIBUTED PHOTODIODE STRUCTURE HAVING MAJORITY DOPANT GRADIENT AND METHOD FOR MAKING SAME

(75) Inventor: Wayne T. Holcombe, Mountain View, CA (US)

(73) Assignee: Integration Associates Inc., Mountain View, CA (US)

( * ) Notice: Subject to any disclaimer, the term of this patent is extended or adjusted under 35 U.S.C. 154(b) by 378 days.

(21) Appl. No.: 09/920,420

(22) Filed: Aug. 1, 2001

Related U.S. Application Data

(63) Continuation-in-part of application No. 09/448,861, filed on Nov. 23, 1999, now Pat. No. 6,548,878, which is a continuation-in-part of application No. 09/037,258, filed on Mar. 9, 1998, now Pat. No. 6,198,118

(60) Provisional application No. 60/222,296, filed on Aug. 1, 2000.

(51) Int. Cl.[7] ............................................. H01L 31/00
(52) U.S. Cl. ....................................... 257/443; 257/459
(58) Field of Search ................................. 257/431, 443, 257/446, 452, 458, 459, 461, 466

(56) References Cited

U.S. PATENT DOCUMENTS

| 3,377,215 A | 4/1968 | Carter et al. | |
|---|---|---|---|
| 3,437,890 A | 4/1969 | Krohl et al. | 317/235 |
| 3,539,875 A | 11/1970 | Fong et al. | 317/100 |
| 3,553,030 A | 1/1971 | Lebrun | 136/89 |
| 3,607,466 A | 9/1971 | Miyazaki | 148/175 |
| 3,676,741 A | 7/1972 | Forst et al. | 317/234 |
| RE28,032 E | 6/1974 | Scott et al. | 250/211 |
| 3,882,532 A | 5/1975 | Quinn | 357/29 |
| 3,898,686 A | 8/1975 | Conradi | 357/30 |
| 4,415,803 A | 11/1983 | Muoi | 250/214 |
| 4,425,551 A | 1/1984 | Blackmer et al. | 330/261 |
| 4,521,798 A | 6/1985 | Baker | 357/30 |

(List continued on next page.)

FOREIGN PATENT DOCUMENTS

| EP | 0 779 661 A2 | 6/1997 | |
|---|---|---|---|
| GB | 2087181 A | 5/1982 | H03F/1/34 |

OTHER PUBLICATIONS

Yamamoto et al., "Si–OEIC With A Built–In Pin Photodiode", IEEE Transaction On Electron Devices, vol. 42, No. 1, Jan. 1995, pp. 58–63.

Usami et al., "Evaluation Of The Bonded Silicon On Insulator (SOI) Wafer And The Characteristics Of PIN Photodiodes On The Bonded SOI Wafer", IEEE Transactions On Electron Devices, vol. 42, No. 2, Feb. 1995, pp. 239–243.

Kyomasu et al., "An Abnormal Phenomenon Due To Substrate Bias Modulation In The Integrated PIN Photodiode Sensor With Dielectric Isolation", IMTC'94, May 10–12, pp. 238–241.

Copy of European Search Report established for European patent application No. 99200543.9.

Primary Examiner—Douglas Wille
(74) Attorney, Agent, or Firm—Gardner Carton & Douglas LLP

(57) ABSTRACT

A distributed photodiode structure is shown formed on a semiconductor substrate having a first dopant type where a first plurality of diffusions of a second dopant type are formed on a first surface of the substrate. A second plurality of diffusions having the first dopant type are formed on the first surface of the substrate between the first plurality of diffusions. In a further refinement, a second surface of the substrate is diffused with the first dopant type. In yet another refinement, a plurality of trenches are formed on the first surface and the second plurality of diffusions are formed within the trenches.

10 Claims, 12 Drawing Sheets

U.S. PATENT DOCUMENTS

| | | | |
|---|---|---|---|
| 4,625,225 A | 11/1986 | Goodfellow et al. | 357/30 |
| 4,764,732 A | 8/1988 | Dion | 330/59 |
| 4,814,724 A | 3/1989 | Tanigawa | 330/288 |
| 4,835,595 A | 5/1989 | Oho et al. | 357/30 |
| 4,839,610 A | 6/1989 | Mazzucco et al. | 330/278 |
| 4,847,210 A | 7/1989 | Hwang et al. | 437/3 |
| 4,878,031 A | 10/1989 | Main | 330/254 |
| 4,952,867 A | 8/1990 | Anderson et al. | 323/273 |
| 4,961,097 A | 10/1990 | Pirastehfar et al. | 357/30 |
| 4,961,098 A * | 10/1990 | Rosbeck et al. | 357/30 |
| 4,983,251 A | 1/1991 | Haisma et al. | 156/630 |
| 4,996,501 A | 2/1991 | Sano et al. | 330/279 |
| 5,013,681 A | 5/1991 | Godbey et al. | 437/86 |
| 5,066,993 A | 11/1991 | Miura et al. | 357/23.7 |
| 5,101,253 A | 3/1992 | Mizutani et al. | 357/30 |
| H1137 H | 2/1993 | Easter et al. | 437/62 |
| 5,216,237 A | 6/1993 | Ritchie et al. | 250/214.1 |
| 5,239,193 A | 8/1993 | Benton et al. | 257/292 |
| 5,243,215 A | 9/1993 | Enomoto et al. | 257/443 |
| 5,329,115 A | 7/1994 | Lim | |
| 5,344,499 A | 9/1994 | Kanbara et al. | 136/258 |
| 5,360,987 A | 11/1994 | Shibib | 257/446 |
| 5,369,799 A | 11/1994 | Tsunoda | 455/38.3 |
| 5,392,171 A | 2/1995 | Kovner et al. | 360/65 |
| 5,408,197 A | 4/1995 | Miyake | 330/129 |
| 5,449,943 A | 9/1995 | Kasai et al. | 257/437 |
| 5,450,035 A | 9/1995 | Kinoshita | 330/129 |
| 5,452,473 A | 9/1995 | Weiland et al. | 455/88 |
| 5,507,023 A | 4/1996 | Suganuma et al. | 455/234.1 |
| 5,587,611 A | 12/1996 | Botka et al. | 257/458 |
| 5,598,022 A | 1/1997 | Kyomasu | 257/458 |
| 5,633,526 A | 5/1997 | Kudo et al. | |
| 5,646,437 A | 7/1997 | Kasai et al. | 257/437 |
| 5,729,038 A | 3/1998 | Young et al. | 257/460 |
| 5,767,953 A | 6/1998 | McEwan | 356/5.01 |
| 5,773,352 A | 6/1998 | Hamajima | 438/406 |
| 5,773,355 A | 6/1998 | Inoue et al. | 438/459 |
| 5,793,060 A | 8/1998 | Morikawa | 257/85 |
| 5,801,084 A | 9/1998 | Beasom et al. | 438/457 |
| 5,821,597 A | 10/1998 | Nakajima et al. | 257/458 |
| 5,963,785 A | 10/1999 | Katoh et al. | 438/33 |
| 6,169,765 B1 | 1/2001 | Holcombe | 375/238 |
| 6,198,118 B1 | 3/2001 | Holcombe | 257/292 |
| 6,320,115 B1 * | 11/2001 | Kataoka et al. | 136/251 |

* cited by examiner

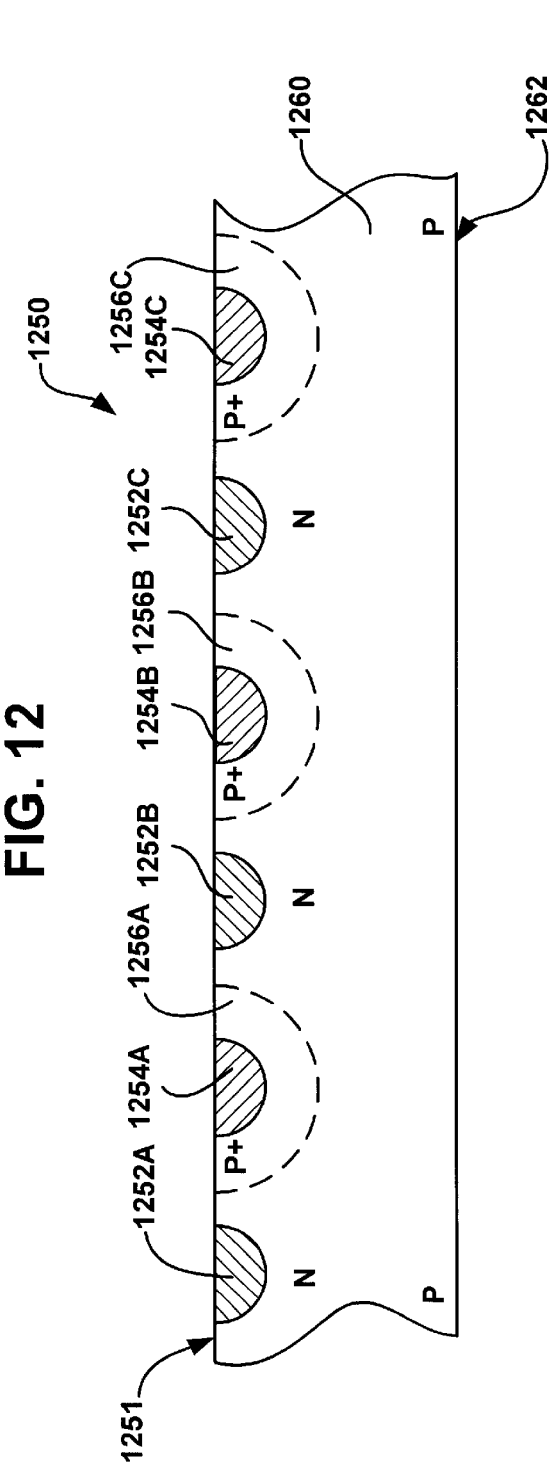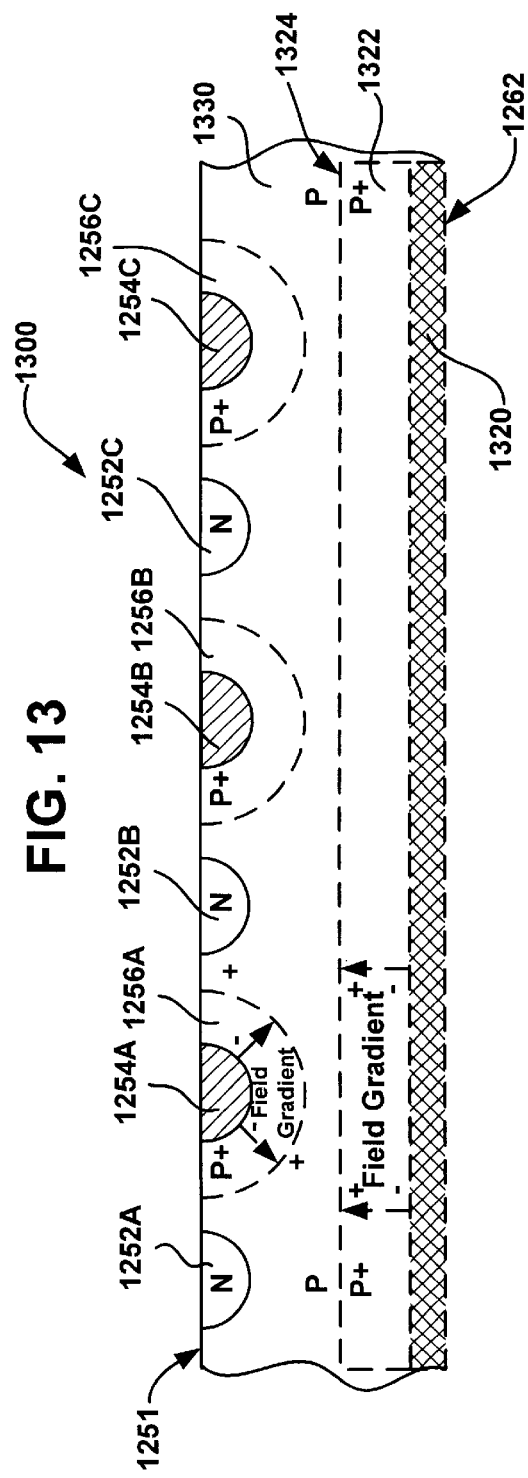

DISTRIBUTED PHOTODIODE STRUCTURE HAVING MAJORITY DOPANT GRADIENT AND METHOD FOR MAKING SAME

This application is a continuation-in-part of U.S. application Ser. No. 09/448,861, filed Nov. 23, 1999 now U.S. Pat. No. 6,548,878, which is a continuation-in-part of U.S. application Ser. No. 09/037,258, filed Mar. 9, 1998, now U.S. Pat. No. 6,198,118 B1, which issued Mar. 6, 2001. This application further claims the benefit of U.S. Provisional Application No. 60/222,296, filed Aug. 1, 2000.

BACKGROUND OF THE INVENTION

1. Field of Invention

The present invention relates to a photodiode which can be fabricated using standard semiconductor fabrication techniques.

2. Description of the Related Art

Infrared wireless data communication is a useful method for short range (in the approximate range of 0–10 meters) wireless transfer of data between electronic equipment; such as, cellular phones, computers, computer peripherals (printers, modems, keyboards, cursor control devices, etc.), electronic keys, electronic ID devices, and network equipment. Infrared wireless communication devices typically have the advantages of smaller size, lower cost, fewer regulatory requirements, and a well defined transmission coverage area as compared to radio frequency wireless technology (i.e. the zone of transmission is bounded by physical walls and therefore more useful in an office environment). In addition, infrared wireless communication has further advantages with regard to reliability, electromagnetic compatibility, multiplexing capability, easier mechanical design, and convenience to the user as compared to cable based communication technology. As a result, infrared data communication devices are useful for replacing 0–10 meter long data transfer cables between electronic devices, provided that their size and costs can be reduced to that of comparable cable technology. As examples of the type of wireless communications links that are presently in use, the Infrared Data Association (IrDA) Physical Layer Link Specification 1.le specifies two main physical layer infrared modulation protocols.

The IrDA Physical Layer Link Specification 1.le also specifies two modes for modulation of data on the infrared transmitted signal. One mode is a low-speed (2 Kbp/s to 1.15 Mbp/s) on-off infrared carrier using synchronous modulation where the presence of a pulse indicates a 0 bit and the absence of a pulse indicates a 1 bit. The second mode is a high speed (4 Mb/s) synchronous Four Pulse Position Modulation (4 PPM) method in which the time position of a 125 nS infrared pulse in a 500 nS frame encodes two bits of information. The 1.le specification also specifies a preamble pattern which is sixteen repeated transmissions of a predetermined set of symbols.

Infrared data communications devices typically consist of transmitter and receiver components. The infrared data transmitter section consists of one or more infrared light emitting diodes (LEDs), an infrared lens, and an LED current driver. A conventional infrared data receiver typically consists of an infrared photodiode and a high gain receiver amplifier with various signal processing functions, such as automatic gain control (AGC), background current cancelling, filtering, and demodulation. For one-directional data transfer, only a transmitter at the originating end and a receiver at the answering end is required. For bi-directional communication, a receiver and transmitter at each end is required. A combined transmitter and receiver is called a transceiver.

A representative example of a conventional infrared data transmitter and receiver pair is shown in FIG. 1A. Infrared transmitter 10 includes LED 16 which generates a modulated infrared pulse in response to transistor 14 being driven by the data signal input at $D_{IR}$. The modulated infrared signal is optically coupled to an infrared detector, such as photodiode 24 normally operated in current mode (versus voltage mode) producing an output current which is a linear analog of the optical infrared signal falling on it. The infrared pulses generated by LED 16 strike photodiode 24 causing it to conduct current responsive to the data signal input at $D_{IR}$ thereby generating a data signal received at $D_{IR}$.

In receiver 20, the signal received at $D_{IR}$, is transformed into a voltage signal $V_{IR}$ and amplified by amplifier 26. The signal output from amplifier 26 then feeds into comparator 42 which demodulates the received signal by comparing it to a detection threshold voltage $V_{DET}$ in order to produce a digital output data signal at $D_{OUT}$. The received signal waveform will have edges with slope and will often include a superimposed noise signal. As a result, $V_{DET}$ is ideally placed at the center of the received signal waveform so that the output data signal has a consistent waveform width despite the slope of the received signal edges. Also, placing $V_{DET}$ the center of the received signal -improves the noise immunity of receiver 20 because the voltage difference between $V_{DET}$ and both the high and low levels of the received signal is maximized such that noise peaks are less likely to result in spurious transitions in $D_{OUT}$.

The received signal, however, can vary in amplitude by several orders of magnitude due primarily to variations in the distance between transmitter 10 and receiver 20. The strength of the received signal decreases proportional to the square of the distance. Depending on the range and intensity of the infrared transmitter, the photodiode outputs signal current in the range of 5 nA to 5 mA plus DC and AC currents arising from ambient infrared sources of sunlight, incandescent and fluorescent lighting. As a consequence, the center of the received signal waveform will vary, whereas $V_{DET}$ Must generally be maintained at a constant level. To address this problem, receivers typically include an automatic gain control (AGC) mechanism to adjust the gain responsive to the received signal amplitude. The received signal is fed to AGC peak detector 36 which amplifies the signal and drives current through diode 32 into capacitor 28 when the signal exceeds the AGC threshold voltage $V_{AGC}$ in order to generate a gain control signal. The gain control signal increases in response to increasing signal strength and correspondingly reduces the gain of amplifier 26 so that the amplitude of the received signal at the output of amplifier 26 remains relatively constant despite variations in received signal strength.

At a minimum, infrared receiver 20 amplifies the photodetector signal current and then level detects or demodulates the signal when it rises above the detect threshold $V_{DET}$ thereby producing a digital output pulse at $D_{OUT}$. For improved performance, the receiver may also perform the added functions of blocking or correcting DC and low frequency AC ambient (1-300 uA) signals and Automatic Gain Control (AGC) which improves both noise immunity and minimizes output pulse width variation with signal strength.

The structure of the conventional discrete PIN photodiode 24 is illustrated in FIG. 1B. A wafer 50 is lightly doped with N dopant in order to produce an intrinsic region 56. A P+ region 52 is formed on one surface of the wafer and an N+ region 58 is formed on the opposing surface of wafer 50 with intrinsic region 56 interposed P+ region 52 and N+ region 58. A reflective layer 60, typically gold, is disposed on the surface containing P+ region 58 with reflective layer 60 also serving as the electrical contact to N+ region 58. A metal contact 54 is disposed on the surface containing P+ region 52 to provide the electrical connection to the P+ region.

Typically, one power supply potential is applied to the reflective layer 60 and another power supply voltage is applied to contact 54 to reverse bias the PN junction formed by P+ region 52 and N+ region 18. This forms a large depletion region within the intrinsic region 56 wherein electron and hole charge carrier pairs generated by light photons incident upon the intrinsic region 56 are rapidly accelerated toward the P+ and N+ regions respectively by the electric field of the reverse bias voltage. Charge carrier pairs are also typically generated outside the depletion region within intrinsic region 56 which diffuse, due to random thermal motion of the carriers, at a much slower velocity until they reach either the depletion region or the junction formed by P+ region 52 and intrinsic region 56 of photodiode 24.

A conventional photodiode that is designed for high quantum, i.e. light conversion, efficiency requires that the light path within the photo current collection zone, i.e. the depletion and non-depletion zones within intrinsic region 56, be sufficient in length so that most of the light photons of the incident light signal area are absorbed and converted into electron-hole pairs that are collectable at the P+ and N+ regions. Usually, this requires that the width of the intrinsic region 56, which is the primary light collection region, be several times the length required for light absorption. If diode 10 has an efficient back-side reflector, such as reflective layer 60, which effectively doubles the light path within diode 24, then the intrinsic region 56 of the photodiode can be made narrower. For a typical near infrared silicon photodiode, the nominal absorption path length is about 15–25 microns. The path length should be at least two to three times the nominal absorption path length to obtain good light conversion efficiency.

On the other hand, a photodiode designed for high frequency response requires that the photo current pairs generated by the light signal be collected rapidly and that the diode RC time constant is fast. Rapid photo current pair collection usually requires that most of the photo current pairs generated by the light signal be generated with the depletion region formed by the reverse bias voltage because the pairs will have a high drift velocity. Otherwise, the photo generated charge carrier pairs produced in the non-depletion regions within intrinsic region 56 and within diffusion distance of the collection electrodes 52 and 58 will have a diffusion velocity that is several hundred times slower than the velocity of the pairs generated within the depletion zone. The photo generated charge carrier pairs in the non-depletion zones will slowly migrate for collection at P+ region 52 and N+ region 58 resulting in a tall on the trailing edge of the electrical signal corresponding to the light signal. The diffusion distance of the charge carriers is determined by the carrier mean free path before re-combination and may exceed 150 microns.

A fast RC time constant for photodiode 24 requires minimal capacitance and low series resistance between the electrical contacts 54 and 60 and the photo current pair collection sites at the margin between P+ region 52 and the depletion zone and the margin between N+ region 58 and the depletion zone. The greater the width of the intrinsic region 56, the greater the width of the depletion zone and the lower the capacitance per unit area of photodiode 24. Since the width of the depletion zone increases with the magnitude of the reverse bias voltage, it is typical for high speed photodiodes to have a relatively high reverse voltage applied to them.

The inclusion of lightly doped intrinsic region 56 between the P+ and N+ regions 52 and 58 results in a PIN photodiode with a wider depletion region, depending on the magnitude of the reverse bias voltage, which improves the light collection efficiency, increases speed, and reduces capacitance over that of a simple PN diode structure.

The PIN photodiode is typically produced by diffusing the N+ region 58 on the back side of the lightly doped (N) wafer 50, diffusing the P+ region 52 on the topside of the wafer 50, and then adding metal contacts to each side of the wafer. Typically, the backside contact area connected to N+ region 58 is reflective layer 60 and is made of gold. The reflective layer is then typically connected to the ground voltage terminal.

A PN diode junction can also function as a photodiode. However, the photo-current collection region within an electric field, the drift region, in a PN photodiode is limited to the relatively thin depletion zone produced when the PN junction is reverse biased. This thin drift region is much less efficient in the collection of photo-generated charge carrier pairs because most of the pairs are generated outside of the depletion zone. Also, the charge pairs generated outside of the depletion zone thermally diffuse to collection points margins of the P and N layers and into the depletion zone at a much slower relative speed resulting in slow photodiode performance. In addition, the highly doped P and N regions result in high diode capacitance per unit area which further slows the performance of the photodiode.

Although a PIN photodiode outperforms a standard PN diode, the PIN photodiode structure cannot be easily manufactured by standard semiconductor processes wherein fabrication is typically performed on only one side of the semiconductor wafer 50.

In typical high volume applications, it is now standard practice to fabricate the receiver circuitry and transmitter driver in a single integrated circuit (IC) to produce a transceiver IC. As described above, it is difficult to integrate an efficient photodiode on the same semiconductor substrate as the transceiver circuit. As a result, a discrete infrared photodiode is typically assembled with the transceiver circuit and an LED, along with lenses for the photodiode and LED, into a plastic molded package to form a transceiver module. The transceiver module is designed to be small in size and allow placement in the incorporating electronic device so as to have a wide angle of view, typically through an infrared window on the transceiver casing. The transceiver IC is designed to digitally interface to some type of serial data communications device such as an Infrared Communication Controller (ICC), UART, USART, or a microprocessor performing the same function.

SUMMARY OF THE INVENTION

The present invention relates to a distributed photodiode which can be fabricated using standard semiconductor fabrication processes and which incorporates dopant gradients that effect the migration of charge carriers.

An embodiment of a distributed photodiode, according to the present invention, is composed of a substrate doped with a first dopant type and having first and second planar surfaces. The photodiode includes a first plurality of diffusions doped with a second dopant type and formed on the first planar surface of the substrate. A second plurality of diffusions of the photodiode are doped with the first dopant type and formed on the first planar surface of the substrate interposed the first plurality of diffusions. A first contact having a first plurality of connective traces is disposed on the first planar surface of the substrate and coupled to each of the first plurality of diffusions.

An embodiment of a method for producing a photodiode, according to the present invention, involves providing a substrate having first and second planar surfaces, doping the substrate with a first dopant type, and diffusing a second dopant type at a plurality of sites on the first planar surface of the substrate to form a first plurality of diffusions. The method further recites diffusing the first dopant type at another plurality of sites on the first planar surface of the substrate to form a second plurality of diffusions. The method also calls for disposing a first set of conductive traces on the first surface planar surface to interconnect each of the first plurality of diffusions.

Another embodiment of a photodiode, according to the present invention, includes a substrate doped with a first dopant type and having first and second planar surfaces and a first plurality of diffusions, the first plurality of diffusions being doped with a second dopant type and formed on the first planar surface of the substrate. The photodiode also includes a backside diffusion formed on the second planar surface of the substrate, the backside diffusion being doped with the first dopant type. The photodiode also includes a first contact having a first plurality of connective traces disposed on the first planar surface of the substrate and coupled to each of the first plurality of diffusions.

The features and advantages of the present invention will become more readily apparent from the following detailed description of a preferred embodiment of the invention which proceeds with reference to the accompanying drawings.

BRIEF DESCRIPTION OF THE DRAWINGS

In the following drawings, elements which are identical or analogous between drawings are identified with reference numbers which are also identical or analogous.

FIG. 12 is a cross-sectional diagram of an embodiment of a photodiode, according to another aspect of the present invention, having surface diffusions to form a dopant gradient;

FIG. 13 is a cross-sectional diagram of an embodiment of a photodiode, according to another aspect of the present invention, including a backside diffusion to form a dopant gradient.

DETAILED DESCRIPTION OF THE PRESENT INVENTION

Figure 1:
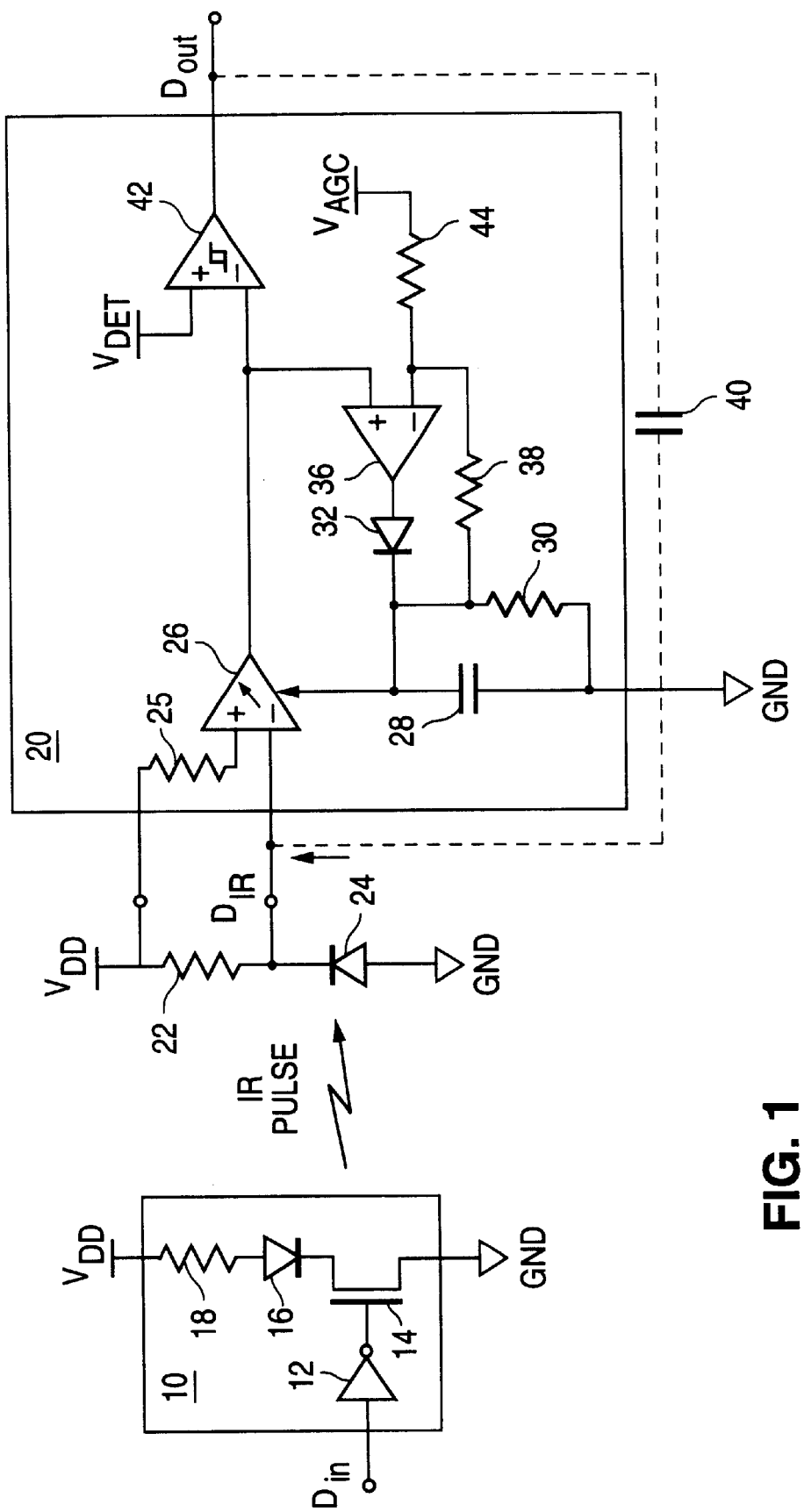
FIG. 1 is a circuit diagram of a conventional infrared transmitter receiver pair.
Figure 2:
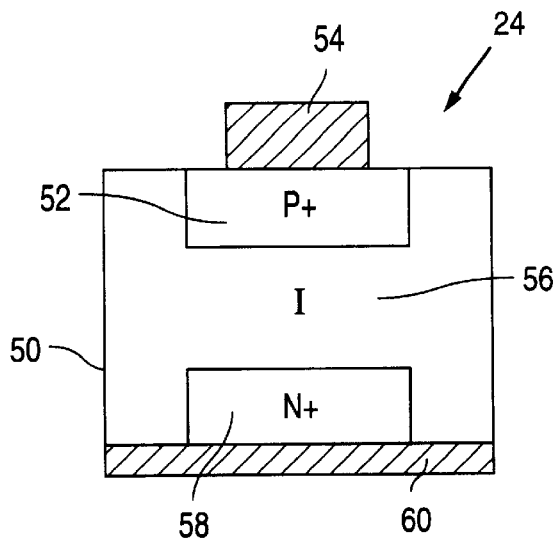
FIG. 2 is a cross-sectional diagram of a conventional PIN photodiode.

Because of the cost associated with assembling the transceiver module into a single package, it is desirable to integrate the photodiode and the receiver circuit on a single silicon substrate. However, constructing an IrDA receiver or transceiver with an integrated photodiode has typically not been either cost effective or sufficiently optically sensitive to have the range to meet, for example, the IrDA lowspeed specification.

In general, IrDA receivers typically use discrete photodiodes with areas of 3.4 to 25 square millimeters in order to produce the minimum signal level, typically 30 nA to 220 nA, required by the minimum detect threshold of an IrDA receiver at a range of 1 meter. A receiver or transceiver IC typically has an area of 2 to 10 square millimeters depending upon the IC fabrication process technology employed and the complexity of the circuit design.

Although PN photodiodes can be constructed using a standard IC fabrication process, the resulting photodiodes typically suffer from reduced efficiency, signal bandwidth, or very high capacitance as compared to PIN photodiodes fabricated using a process optimized for photodiodes. Because there are significantly fewer processing steps and fewer photo-lithographic masks of low optical resolution required for a photodiode optimized process, a PIN photodiode specific silicon process typically costs about one half or less per unit area than a modem silicon IC process. In addition, because process yields are higher and testing is simpler for a photodiode specific process, there is a further reduction in cost per area of perhaps another 20% to 40%. However, the processing and yield cost advantages of the photodiode specific process are partially offset by the assembly cost incurred in the handling, inventory, die attachment, and bonding of the discrete photodiode into a receiver or transceiver module. Also, using conventional design and fabrication techniques, the photodiodes in an IrDA receiver or transceiver are significantly larger than the receiver or transceiver IC and the photodiodes can be fabricated as discrete devices at lower cost per unit area. Thus, it is more cost effective not to integrate the photodiodes with the receiver or transceiver, despite the savings obtained by eliminating the photodiode assembly cost.

Furthermore, PIN photodiodes constructed using a standard IC process will have a light conversion efficiency per unit area which is typically 20% to 80% of the efficiency of a PN photodiode fabricated using a photodiode specific process. Utilizing the assumption that the photodiode processing costs are typically one half that of the IC process, the integrated diode must be less than half the area of an external photodiode in order for an integrated photodiode and receiver or transceiver IC to be more cost effective than a discrete photodiode solution. The integrated photodiode will therefore have a signal output that is only 10% to 40% of the signal output of a cost-equivalent discrete PIN photodiode.

There are still other problems with photodiodes fabricated using standard IC processes. One major problem is that a photodiode fabricated on a standard IC process typically has a capacitance per unit area that is over 100 times higher than the capacitance per unit area of a photodiode fabricated using a process optimized for photodiodes. This increased capacitance causes a significant reduction in the infrared receiver noise/bandwidth performance which in turn requires the use of a larger integrated photodiode than would otherwise be required.

The smallest photodiode signal current which can be detected, given a particular receiver bandwidth, must be greater than the equivalent input noise level of the receiver. Hence, if the receiver's noise level can be reduced then a smaller received signal can be detected. The lower bound on an IC receiver's equivalent input noise level is limited by the input transistor noise performance and area, supply voltage, input device bias currents and the source impedance, which is determined by signal frequency and photodiode capacitance. The principles of low noise photodiode amplifier design, which govern the input noise parameters, are well known to those skilled in the art and will not be expanded upon here. However, given a particular bandwidth, it should be understood that as the capacitance of the photodiode increases and its impedance decreases, then the equivalent input noise current will increase as a square root function, assuming that the infrared receiver amplifier is optimized for minimum noise under these conditions.

For example, a four times increase in the input capacitance of the photodiode will typically result in a two times increase in the equivalent input noise current of a receiver including the photodiode when the receiver is optimized for minimum noise within the same bandwidth. Notice, however, that increasing the area of a photodiode by four times increases the output current gain by four times although it only increases the input noise by two times. Consequently, increasing a photodiode area increases its effective gain, or signal-to-noise ratio, for a given signal illumination level. However, it is also clear that, for a photodiode which has a capacitance that is 100 times greater per unit area, the receiver input noise current of an optimized receiver is increased by 10 fold and therefore requires the minimum detect threshold of the receiver to be increased by 10 fold. Thus, although a photodiode can be constructed using a standard IC process to have only a moderately degraded efficiency as compared to a photodiode constructed using a photodiode optimized process, the 100 fold larger capacitance of the standard IC process photodiode degrades the receiver noise performance so as to effectively reduce input sensitivity by 10 fold.

Another problem is that an efficient photodiode typically uses the substrate as one of the diode contacts because the light absorption depth of the silicon typically exceeds by several times the shallow junctions on standard IC processes. Since the substrate contact is typically P material, this means that the substrate is an anode connection, which is the reverse of standard external photodiode structure which usually have cathode connections to the substrate. Consequently, an integrated photodiode receiver typically needs to be able to function with the anode to substrate, which is usually coupled to a ground potential supply rail.

In view of these constraints, it is nonetheless possible to build an IrDA receiver with sufficient sensitivity and bandwidth to operate using a small photodiode integrated on the same IC. As an example, such a receiver might use a cost effective integrated photodiode of about 2 mm$^2$ in area. Assuming that the integrated photodiode has about 60% of the efficiency of a standard discrete photodiode, the integrated photodiode would output about a 18 nA pulse when suitably lensed and illuminated with 4 uW/cm$^2$ of infrared light, which is the minimum infrared irradiation level specified for IrDA slow speed operation with a $10^{-8}$ bit error rate. The receiver utilizing the integrated photodiode requires an equivalent input noise level over the pulse bandwidth of about 2 nA and a signal detection threshold of about 9 nA.

A major problem for the design of IrDA infrared receivers is output feedback noise. The integrated photodiode is vulnerable to feedback capacitance from the receiver output $D_{OUT}$ to the photodiode. For example, an integrated photodiode of 2 mm$^2$ will have a feedback coupling capacitance in the range of 2 to 10 femto Farads (fF) between the upper surface of the photodiode and the surface of the receiver output bonding wire, which will typically be less than 2 mm distance away. Although the integrated photodiode is smaller than a discrete external photodiode, the integrated photodiode is necessarily located closer to the receiver output because it is on the same IC as the receiver circuit. Consequently, the feedback coupling capacitance is of the same order of magnitude as an external photodiode. In addition, because the receiver must be more sensitive to compensate for the smaller and less efficient integrated photodiode, the effects of feedback are proportionately larger.

Specifically, taking the above examples, if the feedback capacitance is as little as 2 femto Farad and the receiver output has a 5V swing, then 10 femto Coulombs (fC) of charge will be transferred to the receiver input terminal for each transition at the receiver output terminal. If the receiver bandwidth is 600 kHz, which is a typical value for a 115 Kbps lowspeed IrDA receiver, then the time constant of the signal transient is (1/600 kHz)/6.28 or about 265 nsec. Consequently, the 10 fC of charge will have an apparent current amplitude of (10 fC/265 nsec) or 376 nA. Notice that this is over 40 times the minimum detect threshold of 9 nA in the above example and will cause disruption of the input signal over 80% of the operating range of the receiver.

Some of the conventional remedies for output to input feedback problems of IrDA, receivers are: 1) to use a large photodiode so that the output feedback is proportionately small compared with the signal; 2) install shielding between the output and the input photodiode; and 3) balanced differential output lines and/or balanced input photodiodes. All of these solutions entail increased cost either due to increases in total photodiode area, increased package complexity, or the cost of adding a shield.

In addition, for an IrDA receiver or transceiver IC incorporating an integrated photodiode, adding a shield between the photodiode and the receiver output is especially difficult. Since the IC is very small, typically about 3 to 4 mm long, the shield needs to be placed accurately within 1 mm after die attach and wire bonding. This extra assembly process adds cost to the final package. Another difficulty is that the shield must be designed not to block the infrared light falling on the integrated photodiode.

Another receiver output to photodiode input feedback mechanism not present with an external photodiode but which may be present with an infrared receiver integrated with an on-chip photodiode is feedback coupling through the substrate. This may be due to either carriers injected by the receiver circuitry or by distributed RC coupling through the substrate. For this feedback coupling mechanism, external shielding will not work, although some benefit can be had by placing diffused P and N collector rings connected to suitable supply voltages. These act either as limited substrate shields or as collectors for substrate carriers.

Finally, another problem for infrared data receiver performance, whether built with an external or an integrated photodiode, is external noise pickup, most notably from adjacent digital signal lines. Although the magnitude of the external noise signal is typically less than the magnitude of the feedback signal from the receiver's own output terminal, the external noise can cause receiver disruption from digital lines or other close-by circuit nodes with significant AC signal levels. External shields are often used to control noise from external signals, which again increases the cost of the package and/or increases its total size.

Figure 3:
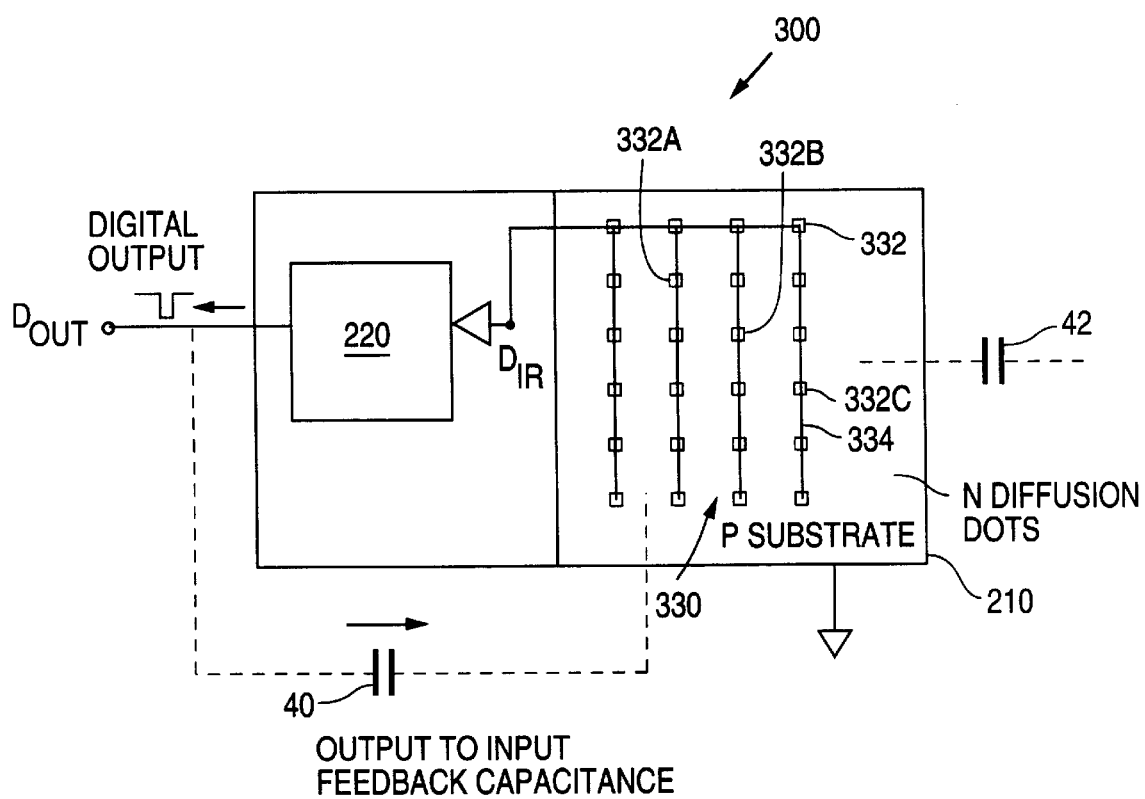
FIG. 3 is a diagram of an embodiment of an integrated receiver and a photodiode according to the present invention.

FIG. 3 illustrates an embodiment of an integrated receiver and photodiode 300 according to the present invention. To reduce the capacitance per unit area arising from the shallow junctions of standard ID processes, a photodiode 330 is constructed by forming the PN junctions of photodiode 330 from N-diffusion dots 332 spaced from one another and connected to one another using conductive traces 334. (N-diffusion dots 332A, 332B and 332C will be discussed in detail but are illustrative of the totality of N-diffusion dots 332 which make up photodiode 330.) The connective traces 334 are coupled to the input terminal $D_{IR}$ of receiver 220. Again, as with photodiode 230, the output terminal $D_{OUT}$ of receiver 220 is capacitively coupled, represented by capacitor 40, to photodiode 330 and a feedback control receiver design can be utilized to reduce the effects of feedback. In addition, there is capacitive coupling to external noise sources, which is represented by capacitor 42.

Figure 4A:
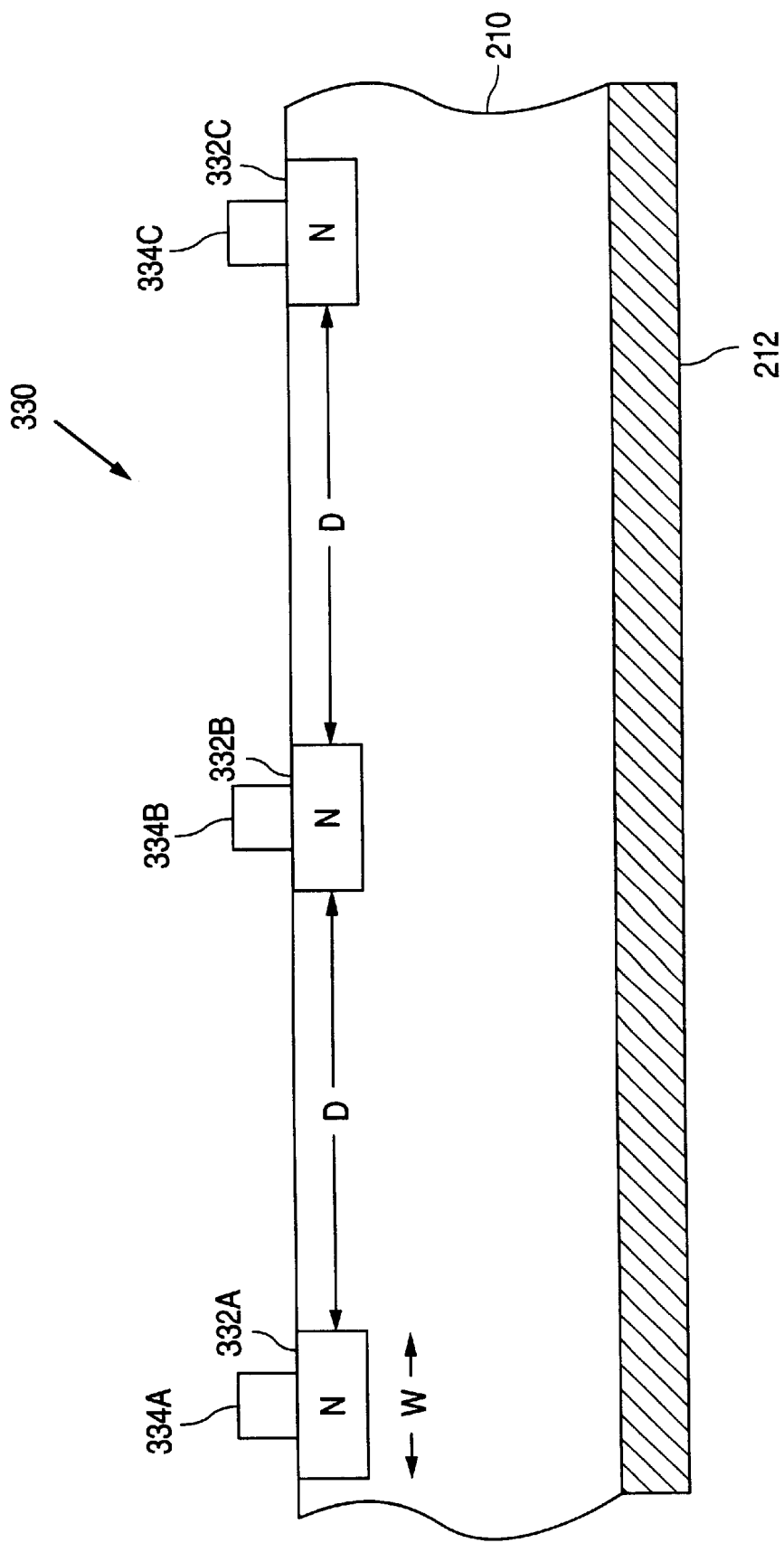
FIG. 4A is a cross-sectional diagram of a portion of the photodiode of FIG. 3.

FIG. 4A is a partial cross sectional view of an embodiment of the photodiode 330 of FIG. 3. Multiple N-diffusions 332A, 332B and 332C are formed in P-substrate 210 at regular intervals to form the PN junctions of photodiode 330. The N-diffusions are formed from minimum geometry dots of width W spaced at a uniform distance D from each other and are then connected together with minimum capacitance interconnects 334A, 334B and 334C, respectively, which can be formed using upper metal layer minimum geometry traces. The junction dot spacing D is determined by the mean free carrier diffusion path and the maximum pulse decay time constant for the receiver. For example, if the mean free carrier diffusion path length is 155 microns and the diffusion velocity of carriers is 300 m/sec and if the N-diffusion dots 332A–C are separated by 50 microns, then the maximum diffusion distance of light generated carriers to a junction dot is about 25 microns, i.e. 25 microns divided in half. This means that the pulse decay time constant is approximately 1.2 usec, the time for the carriers to diffuse 25 microns.

In a typical 0.8 micron BiCMOS process, the minimum diffusion dot size is approximately 2×2 microns. If N-diffusion dots 332A–C are placed every 50×50 microns, then the diffusion junction of photodiode 330 occupies less than $\frac{1}{500}$ of the area of the photodiode. The resulting capacitance from the N-diffusion dots 332 to substrate 210 of photodiode 330 is about $\frac{1}{80}$ of a comparably sized photodiode having a continuous junction. The capacitance to substrate 210 is larger than the junction area ratio due to the added capacitance of the N-diffusion sidewalks and the capacitance of the minimum geometry metal interconnects 334A–C.

Figure 4B:
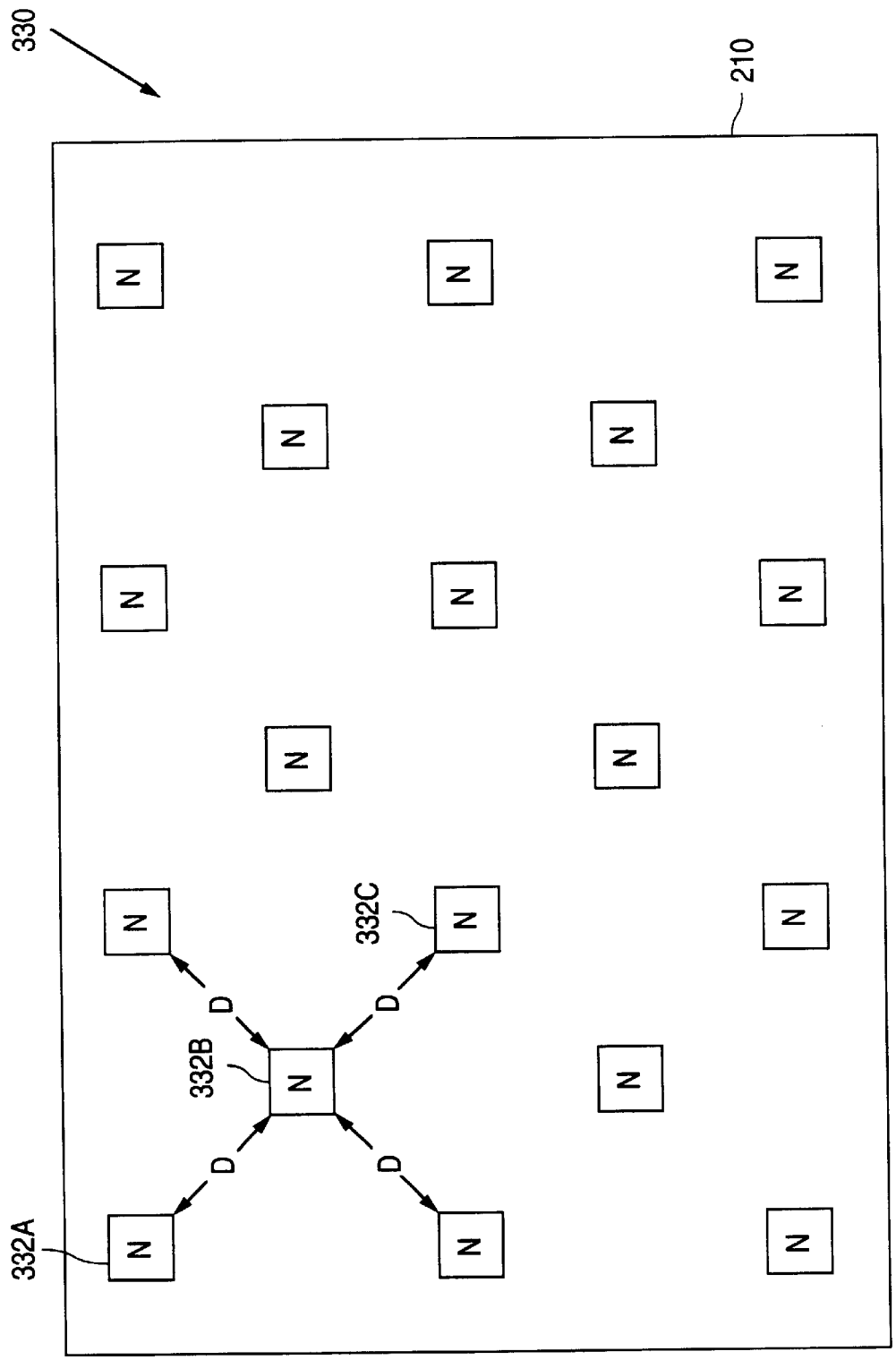
FIG. 4B is a top-view diagram of a portion of the photodiode of FIG. 3.

FIG. 4B is a top view of photodiode 330 which illustrates the distribution of N-diffusion dots on a surface of P-substrate 210. N-diffusion dots 332A–C are spaced at uniform distance D from one another. All the N-diffusion dots are equally spaced and connected via interconnects 334A–C to form photodiode 330.

The distributed structure of photodiode 330 tends to extend the duration of the infrared pulse by about one half the carrier decay time constant, thus it is beneficial to reduce the output pulse width by this amount to restore the output pulses to the input pulse width. The spacing D of the N-diffusion dots 332 can be varied in order to adjust the response speed of the photodiode 330. In addition, commonly assigned, co-pending U.S. patent application Ser. No. 08/864,286 entitled APPARATUS AND METHOD FOR OUTPUT SIGNAL PULSE WIDTH ERROR CORRECTION IN A COMMUNICATIONS RECEIVER, now U.S. Pat. No. 6,169,765, herein incorporated for all purposes, describes a circuit and method which can be employed to normalize the pulse-width of the output pulse of receiver 220.

The connective traces 334 shown in FIGS. 3 and 4A are typically metal strips that are approximately 1 micron wide and spaced at 43 micron intervals. The metal of the connective traces 334 occupies approximately $\frac{1}{40}$ of the amount of surface that would be covered by a conductive layer for a conventional continuous diode. As a result, the connective traces 334 present a smaller antenna for noise signal reception and the capacitive coupling to the feedback signal from the output terminal $D_{OUT}$ and external noise sources is also reduced.

An advantage of the N-diffusion dot method illustrated in the photodiode 330 of FIGS. 4A and 4B is that its effective coupling capacitance to external noise sources and internal substrate RC coupling effects is significantly reduced. (However, it does not provide immunity from substrate carrier noise injected by circuits of the receiver or transmitter also' fabricated on substrate 210.) In photodiode 330, the coupling capacitance is on the order of $\frac{1}{80}$ of the area of the photodiode which results in a significant improvement in the signal to noise ratio of the integrated receiver.

The exposed portions of substrate 210 between the N-diffusion dot connections 334A–C also act as an effective shield with the addition of grounded backplane 212 to photodiode 330 shown in FIG. 4A. Without the backplane, the screen created by the metal interconnect would have similar coupling capacitance to external noise sources as a continuous conductor over the same area. However, in the present invention, the grounded backplane 212 sets up an inverted induced noise signal which neutralizes the noise signal in the field around connective traces 334. As a result, the only noise signal that remains to generate a noise difference signal in a receiver circuit is the $\frac{1}{40}$th of the area of the backplane 212 that is shadowed by the connective traces 334.

Although the total area of the N-diffusion dots 332 of photodiode 330 is about $\frac{1}{40}$th the area for a comparable photodiode having a continuous N-diffusion region, the efficiency of the N-diffusion dots 332 in absorbing thermally migrating photo-generated charge carrier pairs within P-substrate 210 is only about 20% less than that of a continuous N-diffusion region. The heavily doped PN junction formed in diodes formed using standard semiconductor processes result in a depletion layer at the PN junction of only 1 micron. The absorption depth of the incident light, however, is approximately 15 microns. As a result, there are a large number of photo-generated charge carrier pairs produced in P-substrate 210. However, the grounded P-substrate 210 effectively shields these carriers from electrical fields and so the carriers thermally wander, i.e. the carriers are subject to Brownian motion, without the effect of electrical fields upon them.

Thus, each of the photo-generated carriers in P-substrate 210 can be viewed as being at the center of a spherical cloud representing the probability distribution for the thermal migration of that carrier. This spherical cloud has a radius of approximately 150 microns, the average distance travelled by the carriers before recombination. Thus, even though the carriers typically travel a longer distance to reach a PN junction formed by one of the N-diffusion dots 332 than the distance that would be travelled in a photodiode with a continuous PN junction, the probability that each carrier will reach the PN junction of one of the N-diffusion dots 332 before recombining is only slightly reduced. Thus, the distributed structure of photodiode 330 is only marginally less efficient that a comparable photodiode having a continuous PN junction while the capacitance of photodiode 330 is significantly reduced.

Figure 5:
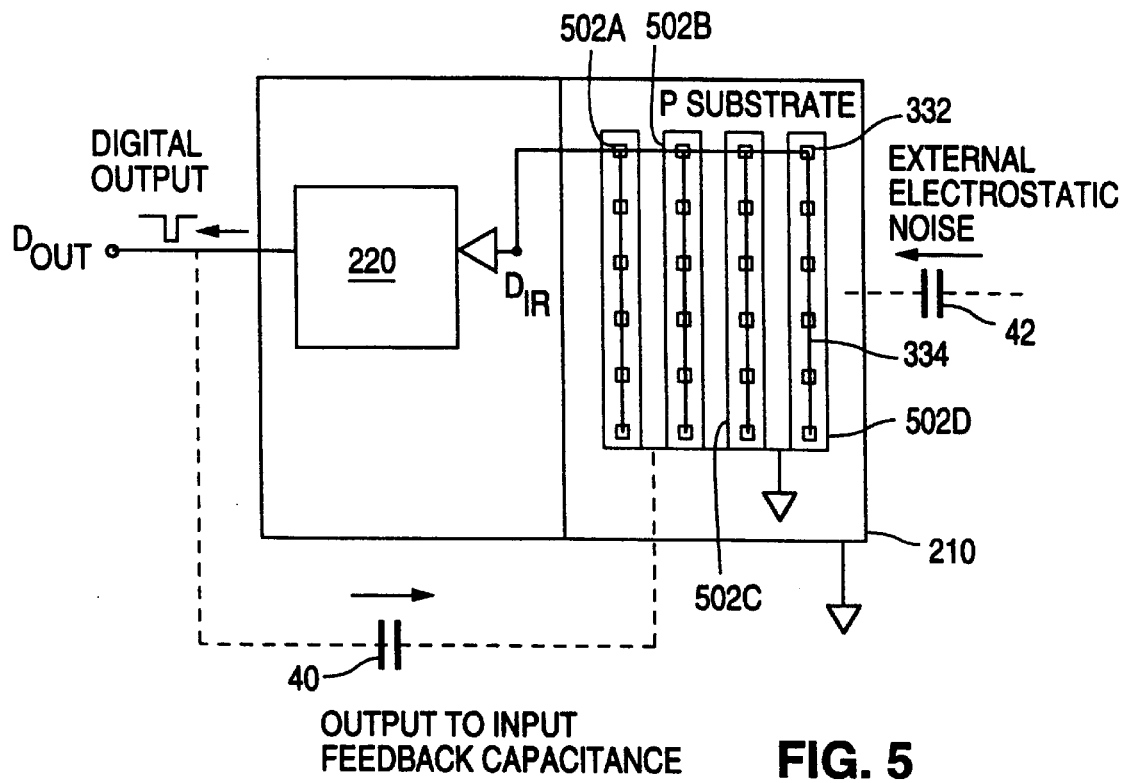
FIG. 5 is a diagram of a n embodiment of the integrated receiver and photodiode of the present invention wherein the photodiode includes a conductive shield.

FIG. 5 illustrates the integrated photodiode 330 and receiver 220 shown in FIG. 3 with the addition of a conductive shield 502. The shielding of photodiode 330 can be improved with only a modest increase in photodiode capacitance by disposing conductive shield traces 502A–D above the N-diffusion dots 332 and interconnect traces 334. The conductive shield traces 502A–D are then coupled to a ground potential to thereby ground any noise signal that is incident upon the conductive shield 502. The conductive shield traces 502A–D are typically fabricated using a second metal layer of the semiconductor fabrication process. The addition of conductive shield traces 502A–D to photodiode 330 increases the photodiode capacitance by approximately 50%. However, conductive shield 502 also shields approximately 10 dB of the external noise signal incident upon photodiode 330.

The efficiency and low coupling capacitance of photodiode 330 may be high enough to permit the use of a conventional receiver circuit such as receiver 20 of FIG. 1 as receiver 220 fabricated on the same substrate. In that case, photodiode 330 would be substituted for photodiode 24 in the circuit of FIG. 1, but both photodiode 330 and receiver circuit 20 would be fabricated on the same semiconductor substrate.

Figure 6:
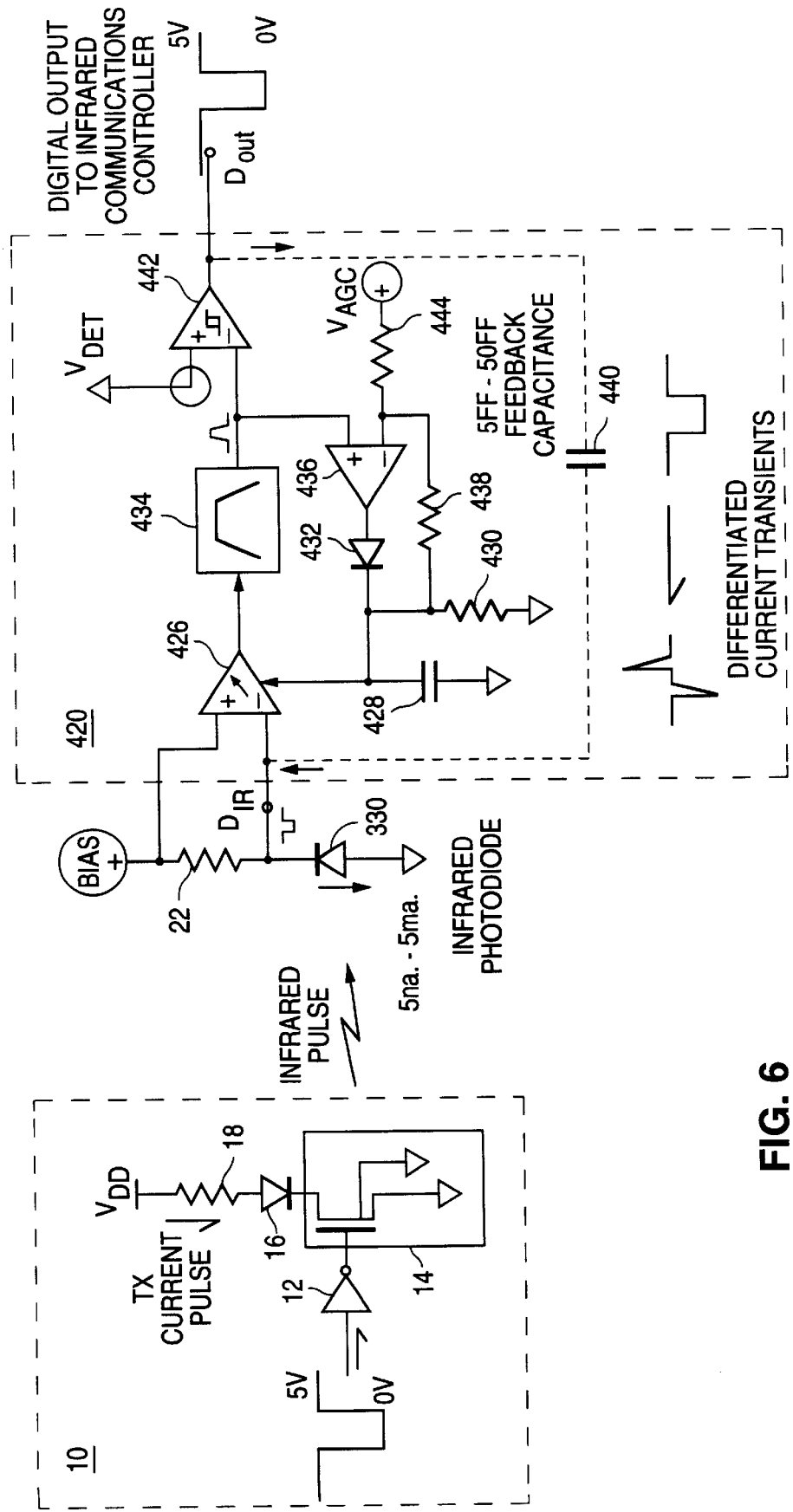
FIG. 6 is a functional block diagram of one embodiment of an infrared receiver circuit suitable for use in the integrated receiver and photodiode of the present invention.

However, the close proximity of the data input $D_{IR}$ and $D_{OUT}$ of a receiver and photodiode pair fabricated on the same substrate, with the effect of additional coupling taking place through the substrate, may make a feedback mitigation receiver circuit design desirable for coping with the feedback signal from $D_{OUT}$ to $D_{IR}$. FIG. 6 illustrates one embodiment of a receiver circuit 420 designed to mitigate the effects of feedback through control of the feedback phase with the design of the receiver bandwidth filter design such that receiver circuit 420 is suitable for use as the receiver circuit 220 of FIG. 3. For infrared receivers which demodulate using on-off modulation (such as the modulation specified by IrDA), it is possible to receive signals significantly below the feedback transient amplitude provided that the feedback is in phase with the received signal. This is accomplished by designing the receiver so that the feedback from the data output is positive such that the feedback actually reinforces the received signal because the polarity of the feedback spike corresponds to the polarity of the received signal. If the receiver transient response has little overshoot, and either no AGC or high signal threshold AGC is used, then the positive feedback acts as dynamic hysteresis, producing an output pulse without any spurious transitions.

The infrared receiver 420 of FIG. 6 is designed so that the feedback through parasitic capacitor 440 from $D_{OUT}$ to the photodiode input $D_{IR}$ is positive. Thus, a negative transition in the received signal at $D_{IR}$ results in a negative transition in the data output signal at $D_{OUT}$ which will, in turn, generate a corresponding negative spike in the feedback signal.

The received signal is countered by the much larger amplitude of the feedback spike which causes the signal at the input of detect comparator 442 to cross the detect threshold $V_{DET}$ repeatedly. This results in multiple transitions in data output signal thereby corrupting the data. When the receiver is designed for positive feedback, as is receiver 420, the positive feedback reinforces the received signal. The positive feedback, when combined with the received signal at $D_{IR}$, results in a signal at the input of comparator 442 that swings farther away from $V_{DET}$ responsive to the edges in $D_{IR}$ generating a single output pulse at $D_{OUT}$.

Bandpass filter 434 must be designed for good damped transient response to suppress signal ringing and overshoot. An example of a suitable filter is a Gaussian bandpass filter, which has roll-off edges in the signal output from the filter that have low ringing and overshoot transient response. In addition, the filter will temporally spread out the energy contained in the feedback spike. For example, a 20 nsec. spike is transformed into a 300 nsec. spike, which further contributes to the dynamic hysteresis discussed above.

However, in order to prevent AGC desensitization, the AGC threshold $V_{CC}$ of receiver 420 needs to be set above the peak feedback value by a margin adequate to prevent the peak feedback value from causing the gain to be adjusted downward by the AGC. There are undesirable consequences of a high AGC threshold compared with a low AGC threshold. First, AGC noise quieting (which reduces signal interference from noise) is less effective. Secondly, the output pulse width will vary more with signal level.

AGC reduces the front end gain of amplifier 426 responsive to an increasing input signal on $D_{IR}$. Generally, in the absence of an input signal, amplifier 426 will be highly sensitive because the AGC permits the gain to be high. In the presence of noise, however, the AGC will reduce the gain in response to the input signal including the noise level. This improves the noise immunity of the receiver 420. The receiver will function so long as the received signal strength is greater than the amplitude of the noise. From a practical standpoint, in a noisy environment, this permits the sending and receiving devices to be moved closer together to strengthen the received signal and the communications link will be able to function. In the absence of AGC, the noise level will prevent the receiver from capturing the transmitted signal without corruption of the output data signal even when the transmitting device and receiver are close together because the noise signal will still have high enough amplitude to cause spurious output transitions in between valid output transitions.

Also, AGC improves the fidelity of the pulses in the data output $D_{OUT}$.

Despite careful filter design, some ringing, overshoot and undershoot will still occur in the receiver. AGC reduces the effect of ringing, overshoot and undershoot when it reduces the sensitivity of amplifier 426. Further, because there is also ramping on the received waveform which can cause widening or narrowing of the signal pulse unless the detect threshold $V_{DET}$ is in the center of the waveform, AGC improves the fidelity of the pulse by maintaining $V_{DET}$ at the center of the waveform.

The amplitude of the positive feedback, however, also causes the AGC to adjust the receiver sensitivity downward. As the AGC reduces the gain in response to the positive feedback, the sensitivity of the receiver to the transmitted signal is also reduced and, particularly at high signal pulse rates, can cause the receiver to lose the input signal.

Whereas the receiver circuit of FIG. 6 is effective in reducing the effects of feedback, it still suffers from the effect of feedback transient overshoot or ringing, which, if it exceeds the detect level $V_{DET}$, will cause undesirable extraneous output pulse transitions. Although the use of well known filter design techniques can limit transient overshoot to a negligible level, in practice, reducing it to a value below ⅕ or ⅒ the peak level is difficult due to variable phase shift effects both within and outside the infrared receiver. Some of these variable phase shift effects are due to normal variances in parameters such as transmit pulse shape, photodiode time constant, photodiode capacitance, receiver output load capacitance, receiver supply voltage, and filter component values.

Receiver 420 can beneficially decrease the disruptive effects of feedback by 10 db–20 db for infrared receivers used with edge triggered, serial data communication controllers which do not need an accurate data pulse width or with receiver systems which do not require the benefits of a low threshold AGC.

Figure 7:
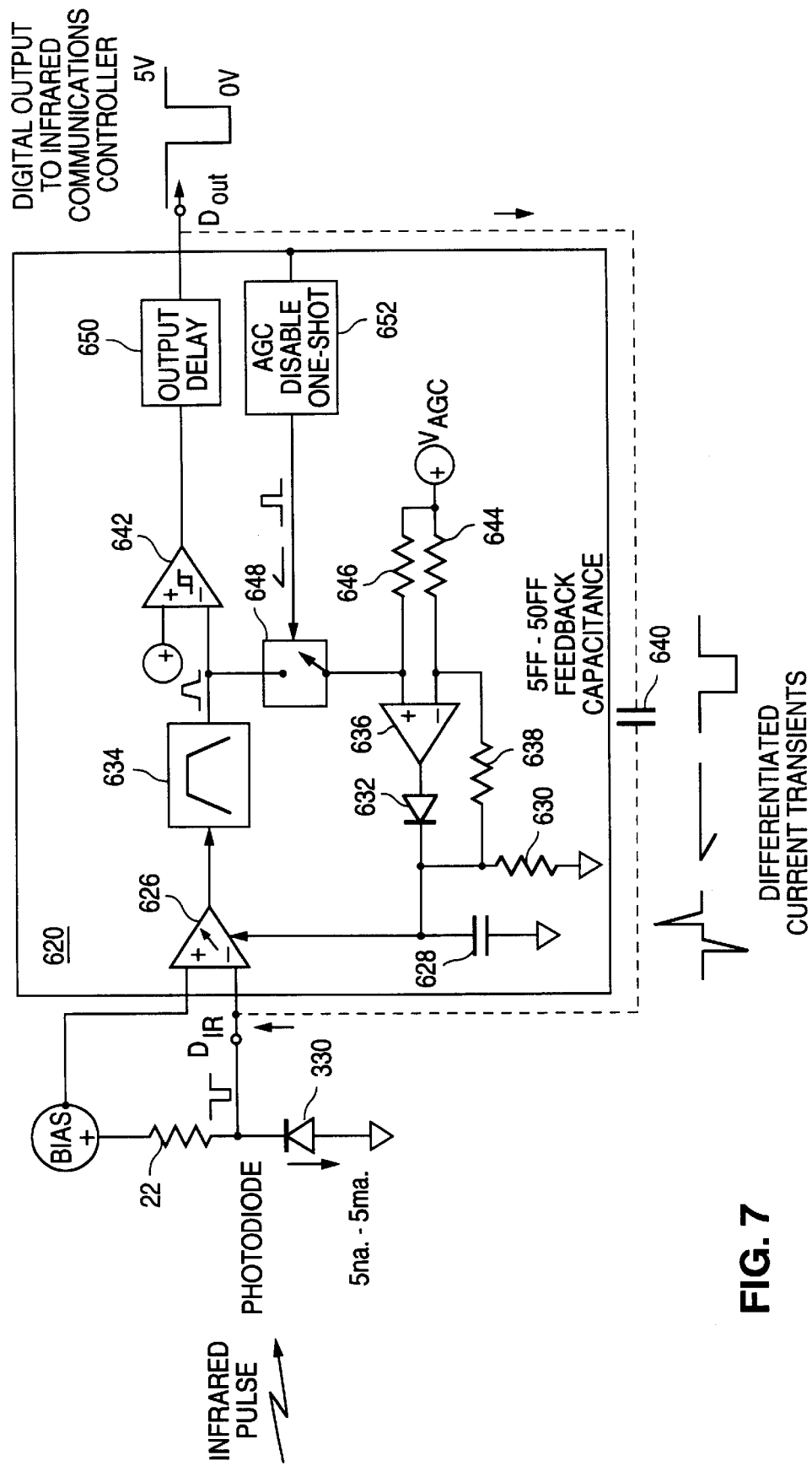
FIG. 7 is a functional block diagram of another embodiment of an infrared receiver circuit suitable for use in the integrated receiver and photodiode of the present invention.

Another embodiment of a receiver suitable for use in the present invention is shown in FIG. 7. Infrared receiver 620, which is suitable for the use of low threshold AGC, adds delay 650 to the output signal from comparator 642, typically delaying the output by ½ of the pulse interval of the data signal to permit decay of the feedback pulse. Receiver 620 also includes a signal disable switch 648 controlled by AGC disable one-shot 652 which blocks the signal to the AGC input upon the leading edge of an output pulse transition on $D_{OUT}$.

By delaying the output signal, the peaks of the feedback signal from $D_{OUT}$ to $D_{IR}$ are shifted in time so that the feedback peak occurs toward the center of the pulse in the received signal at $D_{IR}$. Also, AGC disable one-shot 652 generates a signal disable pulse responsive to the falling edge in the output signal at $D_{OUT}$ which causes AGC disable switch 648 to open and isolate the input of AGC peak detector 636 from the received signal path for the duration of the signal disable pulse. The signal disable pulse must persist for a time interval sufficient for the feedback transient to settle below levels which would cause AGC gain reduction. AGC peak detector 636 is therefore isolated from the signal path at the time that the feedback pulse appears at the negative input to comparator 642. As a result, the gain control voltage stored in capacitor 628 during the disable period reflects the received signal strength and is not corrupted by the feedback signal.

Alternatively, the AGC disable one-shot 652 may be replaced with an output edge triggered disable one shot which will generate a disable pulse responsive to both the falling and rising edges of the output signal at $D_{OUT}$. An edge triggered disable will isolate the AGC peak detector 636 during feedback pulses for both the edges of the output pulse at $D_{OUT}$. This approach has the advantage that larger levels of feedback can be tolerated or the use of a low AGC threshold voltage level is permissible because the gain control voltage is not adversely affected by the feedback pulse from the rising edge of the output signal at $D_{OUT}$.

Whereas the performance of receiver 620 is substantially better than the performance of conventional receivers, it requires that receiver 620 be designed so that the feedback from $D_{OUT}$ to $D_{IR}$ is positive. Negative feedback will still cause spurious transitions in the output signal because the feedback is coupled to the input, of comparator 642.

Figure 8:
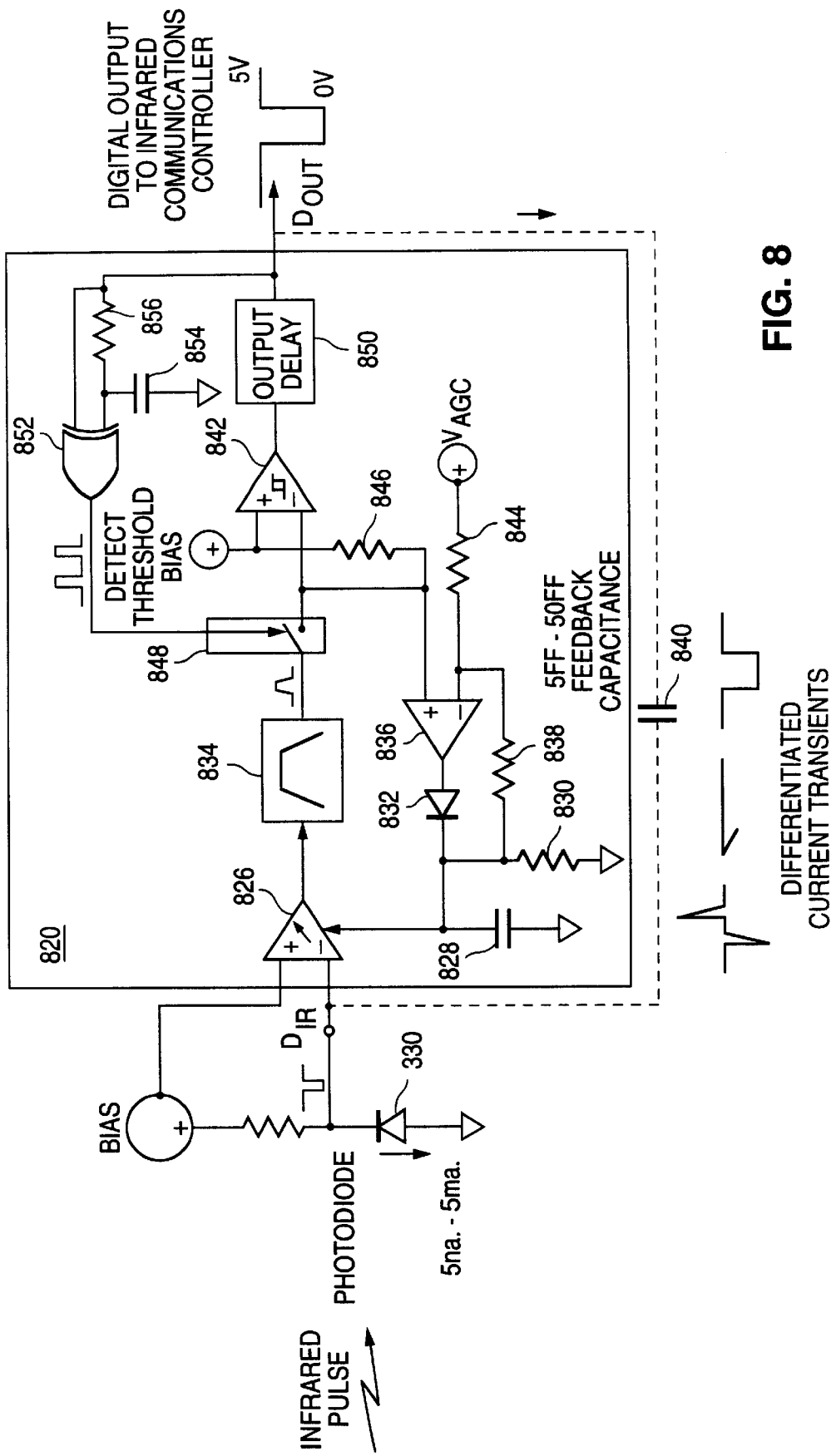
FIG. 8 is a functional block diagram of yet another embodiment of an infrared receiver circuit suitable-for use in the integrated receiver and photodiode of the present invention.

Receiver 820 of FIG. 8 shows yet another embodiment of a single input receiver circuit suitable for use as the receiver 220 in the present invention but where the design of receiver 820 is not dependent upon positive feedback from output terminal $D_{OUT}$ to input terminal $D_{IR}$ signal disable switch 848 is positioned between the output of bandpass filter 834 and the inputs of both comparator 842 and AGC peak detector 836. Output edge triggered disable one-shot 852 receives the delayed output signal at $D_{OUT}$ and generates a disable pulse responsive to each of the falling and rising edges of the output signal. The disable signal must persist for a period long enough for the feedback transients to decay below a level that would cause spurious transitions in the output signal from comparator 842. The disable pulses cause signal disable switch 848 to isolate comparator 842 and AGC peak detector 836 from the received signal path during the times when the falling and rising feedback peaks are present at the output of bandpass filter 834. This configuration permits receiver 820 to obtain the improved AGC performance of receiver 620. However, receiver 820 is not dependent upon positive feedback because the input of comparator 842 is isolated from the feedback peaks, thereby preventing the negative feedback peaks from causing spurious transitions in the output signal at $D_{OUT}$.

FIG. 8 also shows greater detail of an example of an output edge triggered disable one-shot. One input terminal of exclusive-OR gate 852 receives the output signal directly while the other input terminal is coupled to the output signal through resistor 856 and to ground through capacitor 854. Resistor 856 and capacitor 854 further delay the output signal such that, when a pulse edge occurs in the output signal, the two inputs of XOR 852 will be at different values for a time period determined by the RC constant of resistor 856 and capacitor 854, which therefore also determine the width of the disable pulses generated by XOR 852.

Figure 9:
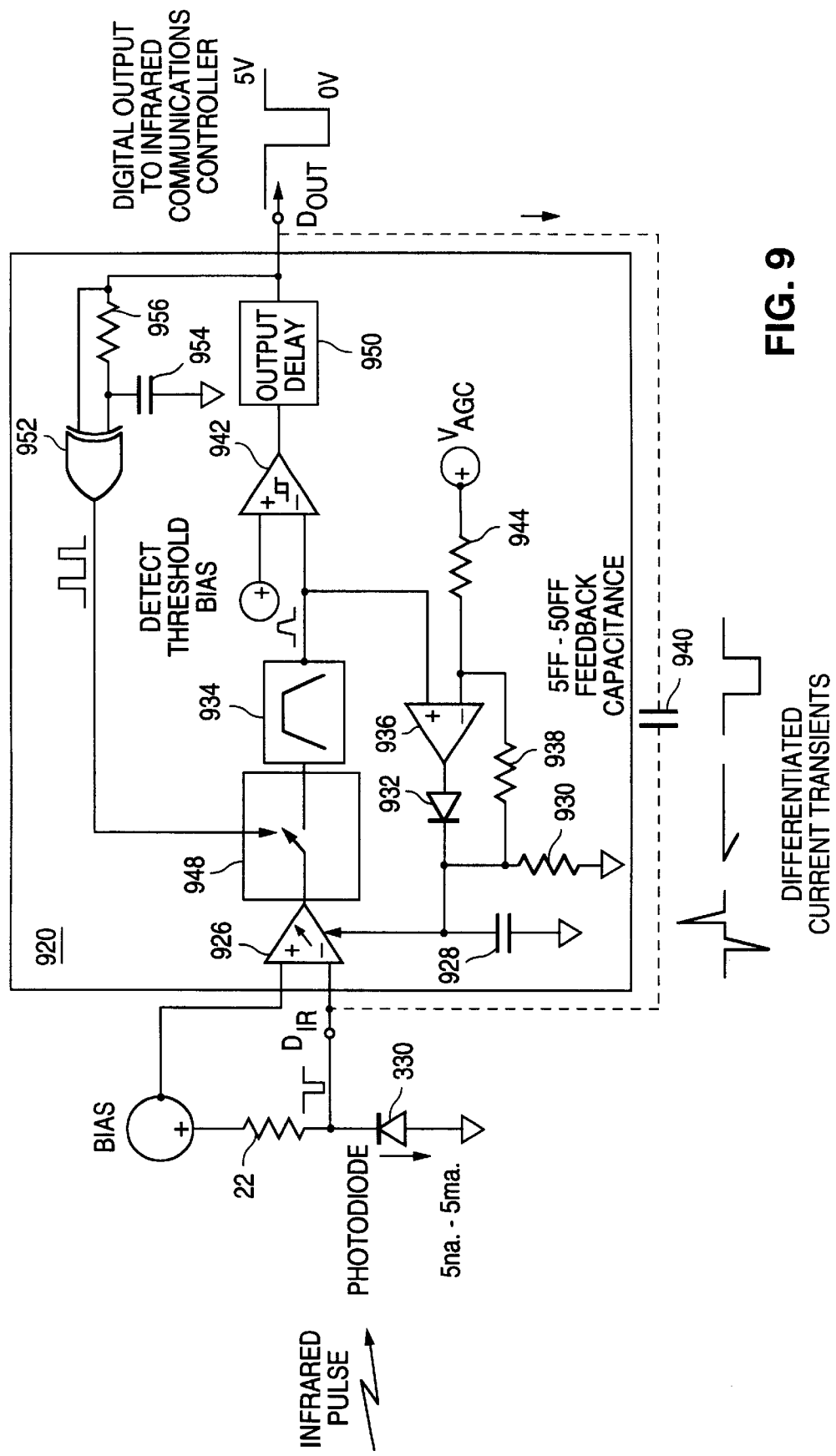
FIG. 9 is a functional block diagram of still yet another embodiment of an infrared receiver circuit suitable for use in the integrated receiver and photodiode of the present invention.

Yet another embodiment of a receiver circuit suitable for use as receiver 220 of FIG. 3 is receiver circuit 920 of FIG. 9. The high amplitude of the feedback pulses can contributes to ringing, overshoot and undershoot at the output of bandpass filter 834 of receiver 820. Thus, receiver 920 is constructed with signal disable switch 948 interposed between the output of input amplifier 926 and bandpass filter 934. This configuration permits the disable pulses generated by XOR 952 responsive to the edges in the output signal to isolate bandpass filter 934, comparator 942 and AGC peak detector 936 from the receive signal path when feedback from $D_{OUT}$. This configuration causes the feedback transient to settle more rapidly because the transient is prevented from entering the bandpass filter 934 where the transient is prolonged due to the increase in ringing, overshoot and undershoot that would otherwise occur due to feedback transients in the output response of bandpass filter 934. This permits receiver 920 to tolerate larger amplitude feedback signals, use a narrower bandwidth to improve the signal to noise ratio of the receiver, or operate at faster pulse rates without corruption of the data output signal at $D_{OUT}$.

Because of variations in device tolerances and operating conditions, it is not possible to exactly predict when the feedback transients in the received signal path will settle. For slower communications formats, the duration of the disable pulses may be extended to account for variations in the settling time of the feedback peaks. However, faster communications formats, such as the 4 MB format described above, have narrow windows because the data is related to the temporal position of the pulse which requires rapid settling times. As a result, the disable signal generated by XOR 952 may not coincide exactly with the feedback peaks.

For example, if the disable signal is 1.5 us, then valid input signal transitions which have less than 1.5 us between them cannot be detected. To capture these signal transitions, it is necessary to set the disable signal duration to the minimum required to prevent feedback disruption. However, due to variances in IC timing circuit tolerances and variances in feedback due to variances in receiver packages and circuit board trace layout, it becomes necessary to set the signal disable period to a larger value than is typically required so as to ensure that most receivers will function without feedback disruption. This adds a difficult engineering burden of correctly determining the optimum signal disable duration and undesirable limiting maximum pulse rate on receiver packages or board layouts which have low feedback levels.

Figure 10:
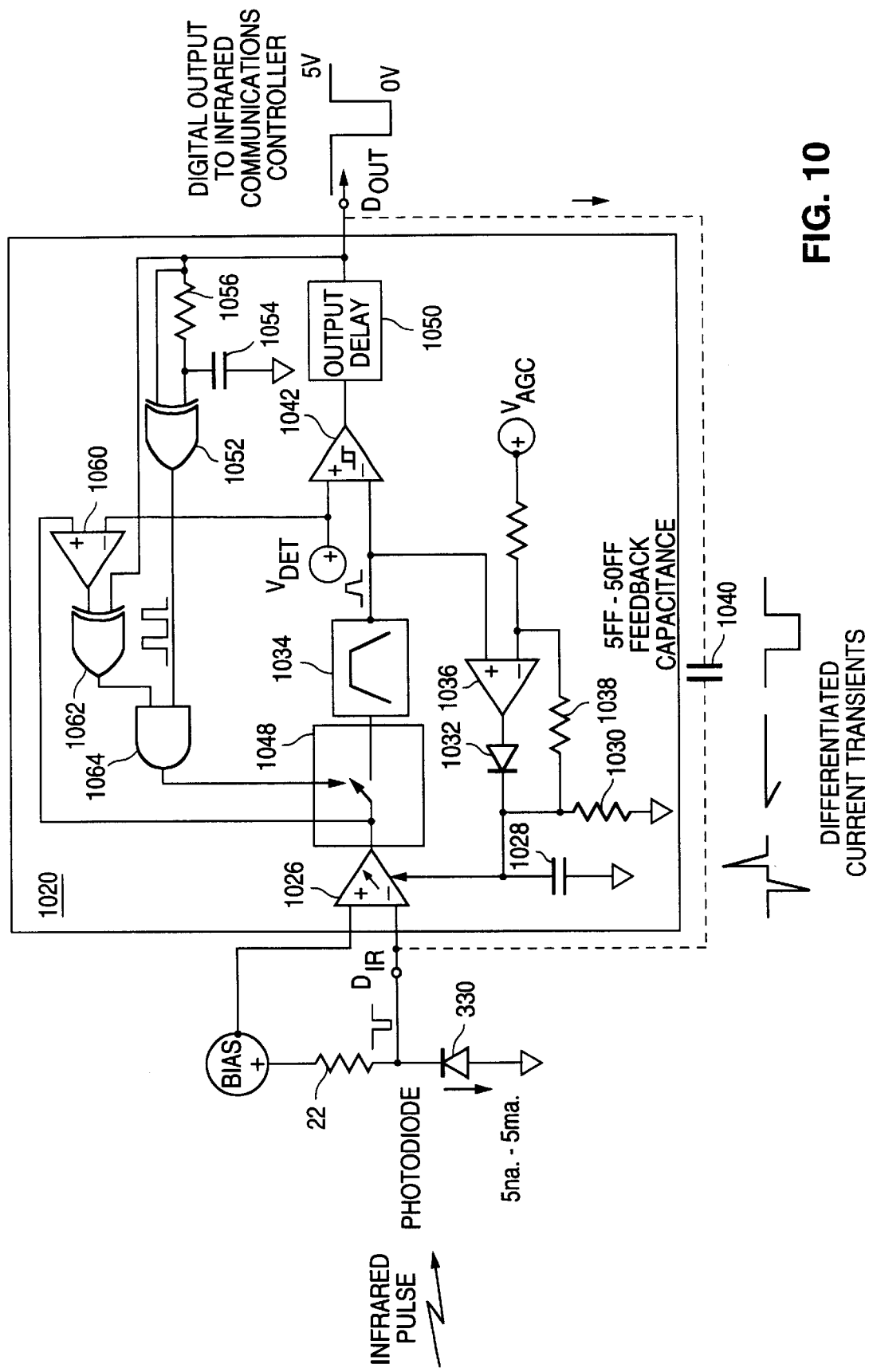
FIG. 10 is a functional block diagram of a further embodiment of an infrared receiver circuit suitable for use in the integrated receiver and photodiode of the present invention.

Yet another embodiment of a receiver circuit suitable for use as integrated receiver 220 is receiver 1020 of FIG. 10. In order to accommodate faster communications formats and address variation in signal settling, receiver 1020 is designed with positive feedback and feedback detection which monitors the feedback transients and prevents signal disable switch 1048 from closing while a feedback transient is present.

Feedback detect comparator 1060 compares the amplified input data signal at the output of input amplifier 1026 to the detection threshold voltage level VDET and output a high level signal so long as the amplified input signal is greater that the detection threshold. Exclusive-OR 1062 compares the output of the feedback detect comparator 1060 with the delayed digital output signal and outputs a high level signal if the two signals differ. Conversely, exclusive-OR 1062 outputs a low level if the two signals are in agreement. This low output signal will propagate through AND gate 1064 to close signal disable switch 1048 before the edge triggered disable signal output from exclusive-OR 1052 would normally cause switch 1048 to close. This permits receiver 1020 to operate at higher speeds when the transient settling time is faster than that predicted solely by the timing of the edge-triggered one shot circuit.

Figure 11:
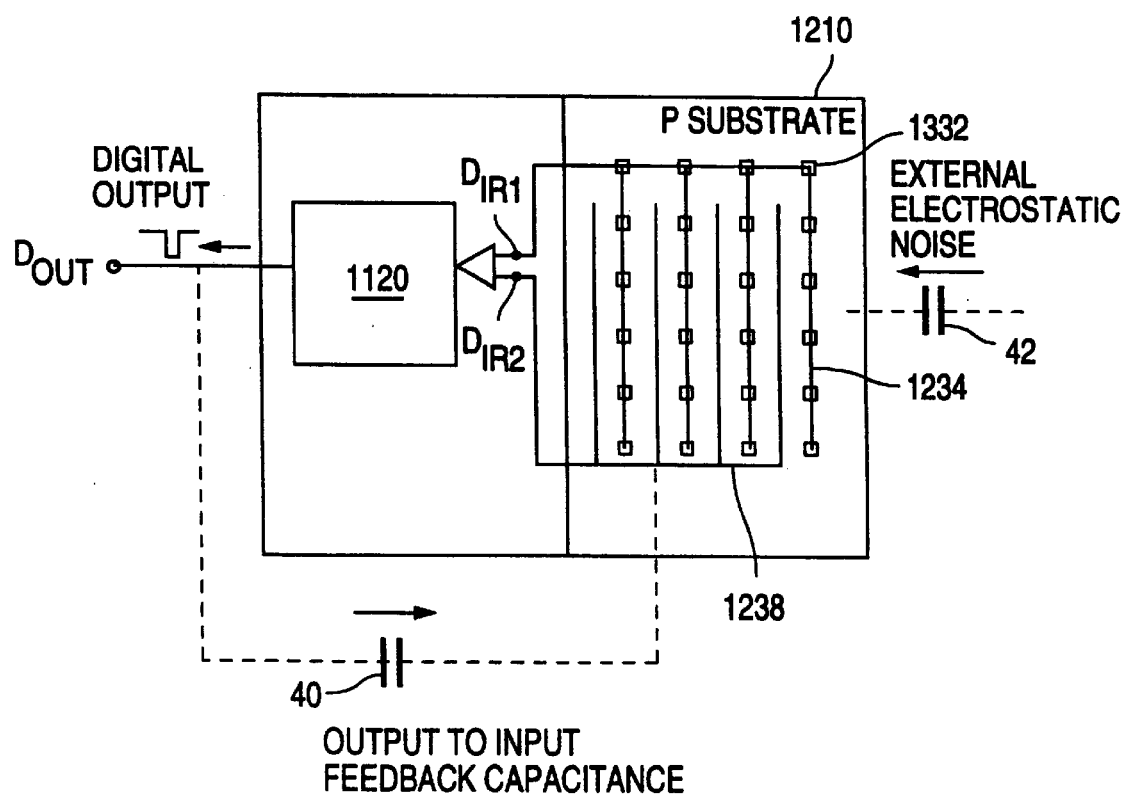
FIG. 11 is a diagram of an embodiment of the integrated receiver and photodiode of the present invention utilizing a photodiode having an additional set of insulated traces for use with a differential input receiver.

The photodiode of the present invention can also be incorporated into differential methods for receiving an infrared signal. FIG. 11 shows another embodiment of a photodiode 1230 according to the present invention which can be employed with a receiver 1120 having a pair of differential inputs $D_{IR}$, and $D_{IR2}$. Photodiode 1230 is similar in structure to photodiode 330 of FIG. 3. As with photodiode 330, a series of N-diffusions 332 are formed in P-substrate 1210 and interconnected via connection traces 1234 to input terminal DIR, of receiver 1120. An additional set of insulated traces 1238 is formed adjacent the connection traces 1234 and connected to input terminal $D_{IR2}$ of receiver 1120.

Because connection traces 1234 and insulated traces 1238 have the same area, they will each receive the same noise signal which is subsequently cancelled by the differential nature of the receiver 1120. Since the insulated traces 1238 occupy only about V50 of the area of the photodiode, they only slightly reduce the light efficiency of the photodiode 330. Because the insulated traces have the same area as connection traces 1234, they will pick up approximately the same magnitude of noise signal. To maximize the differential balance between the connection traces 1234 and the insulated traces 1238, the insulated traces should have the same structure and the connection traces and should be interleaved with the connection traces 1234 as is shown in FIG. 11.

The receiver circuits 420, 620, 820, 920 and 1020 can each be modified to operate in a differential mode with the photodiodes illustrated in FIG. 11, as should be apparent to one skilled in the art.

The PN dotted photodiode disclosed in U.S. patent application Ser. No. 09/037,258, now U.S. Pat. No. 6,198,118 B1, herein incorporated by reference in its entirety for all purposes, teaches how to produce a photodiode having high electric field immunity, low manufacturing costs, and that allows integration of the photodiode on the same integrated circuit (IC) fabrication process used for manufacturing the transceiver circuit. Although this photodiode has sufficient speed performance for use in infrared communication systems that operate at up to 1–2 megahertz of bandwidth, it may not be fast enough for some higher speed applications or systems. For these systems, a conventional PIN photodiode is typically required for adequate speed performance. Such higher speed PIN photodiode systems also require either special shielding against interference from ambient noise or differential diode techniques that generally use a larger amount of silicon area. It is desirable to improve the speed performance of the PN dotted photodiode structure without sacrificing its high electric field immunity or low cost of manufacturing.

For photodiodes that are intended for data communication, the key performance parameters are bandwidth, optical signal gain per unit area, and low capacitance. Bandwidth typically limits the maximum speed of data transmission, optical signal gain typically affects sensitivity, and low capacitance is important to minimize noise. See the discussion above for further explanation of some of these issues.

As discussed above, the bandwidth of the PN dotted photodiode is limited by the diffusion speed of minority carriers to the diffusion dots. Reducing the diffusion dot distance increases speed or bandwidth for minority carriers generated by photon absorption near the surface but does not help much for those carriers generated at silicon depths more than about one-half the dot spacing. Dot spacing less than two times the optical absorption depth generally creates three performance problems. First, the high bandwidth optical gain is typically reduced. Secondly, the total capacitance of the photodiode is increased due to the increased number of diffusion dots and inter-connect metal. Finally, the optical gain is further decreased due to light shielding by opaque interconnect metal.

One partial remedy for the problems involving optical gain and capacitance caused by reducing the dot spacing is to fabricate the photodiode diffusion dots and interconnect metal with smaller dimensioned lithography. Although this can reduce capacitance, fringing effects limit the capacitance reduction obtained with diminishing line widths for line widths of less than the field oxide thickness. For example, typical field oxide thickness is about 1 micron. This means that once a line width falls below 1 micron, then there is little reduction in line capacitance for thinner lines. Increasing oxide thickness would reduce capacitance but field oxides thicker than 1 micron are problematic in that they are more expensive to produce and cause yield problems from the large metal steps required to connect contacts on the surface of the field oxide to the active regions of the photodiode. Similarly, a reduction in line width reduces light shielding effects, but, due to diffraction effects, these improvements are also limited.

Another problem is that the silicon foundries which are most cost effective for manufacturing the PN dotted photodiode are typically not capable of lithography line widths of less than several microns. Silicon foundries suitable for photodiode production tend to specialize in producing silicon products that have low costs per square millimeter; such as, high voltage devices or solar cells, neither of which require sub-micron lithography. Most sub-micron lithography silicon foundries use 20 or more masks to produce very complex products with high functionality or value per square millimeter to offset the correspondingly high costs per square millimeter. Consequently, although it is possible to fabricate the PN dotted photodiode with sub-micron diffusion dots and metal inter-connect traces, the costs would tend to be higher and may require unconventional process changes that are not readily accommodated by most modern silicon foundries.

In the PN dotted photodiode according to the present invention, absorbed photons generate electron hole carrier pairs. The minority carrier portion of these pairs travels by diffusion transport to the diffused dots that are of opposite polarity doping to that of the substrate where they are collected, which causes current to flow that is proportional to the photo flux. Unlike the transport processes of the PIN photodiode, where photons generate carriers in a depletion region and are subject to high drift fields, carrier collection in the PN dotted photodiode depends on much slower non-drift diffusion. For example, it might take approximately 1 microsecond for carriers to diffuse across 50 microns of a non-depleted semiconductor region but less than 1 nanosecond to drift across 50 microns in a depletion region of a PIN photodiode.

In accordance with one aspect of the present invention, the carrier diffusion speed in the PN dotted photodiode can be significantly improved by fabricating the diode with substrate doping gradients having certain characteristics. One characteristic is that the majority doping gradient in the substrate monotonically increases substantially continuously from a lowest doping level adjacent to the dot PN junction to a maximum doping level at points horizontal to the adjacent dot, at one-half of the distance to the adjacent dot, and vertical to the light absorption depth.

The increase in operational speed in the PN dotted photodiode according to this aspect of the present invention is caused by a field gradient produced by the imbalance in majority carriers as they diffuse from areas of high doping levels to those of lower doping levels. Since the majority carriers diffuse away from their associated acceptor or donor dopant atoms, there is a net charge imbalance that creates an internal electric field. This internal field gradient increases with doping gradient. Consequently, an increase in the doping gradient produces a corresponding increase in minority carrier diffusion speed.

For data communications that do not need the increased bandwidth made possible by the above described doping gradient technique, the current collecting diffusion dots can be placed further apart so as to provide bandwidth that is sufficient for the application. By doing this, the capacitance of the photodiode is reduced, which allows a decrease in receiver input noise, improves the signal to noise ratio, and increases effective sensitivity. Also, placing the collecting dots of the distributed photodiode structure further apart reduces the light masking effects caused by the interconnecting metal used to connect the dots to form an electrical contact, which improves the optical gain of the resulting photodiode.

Figure 14:
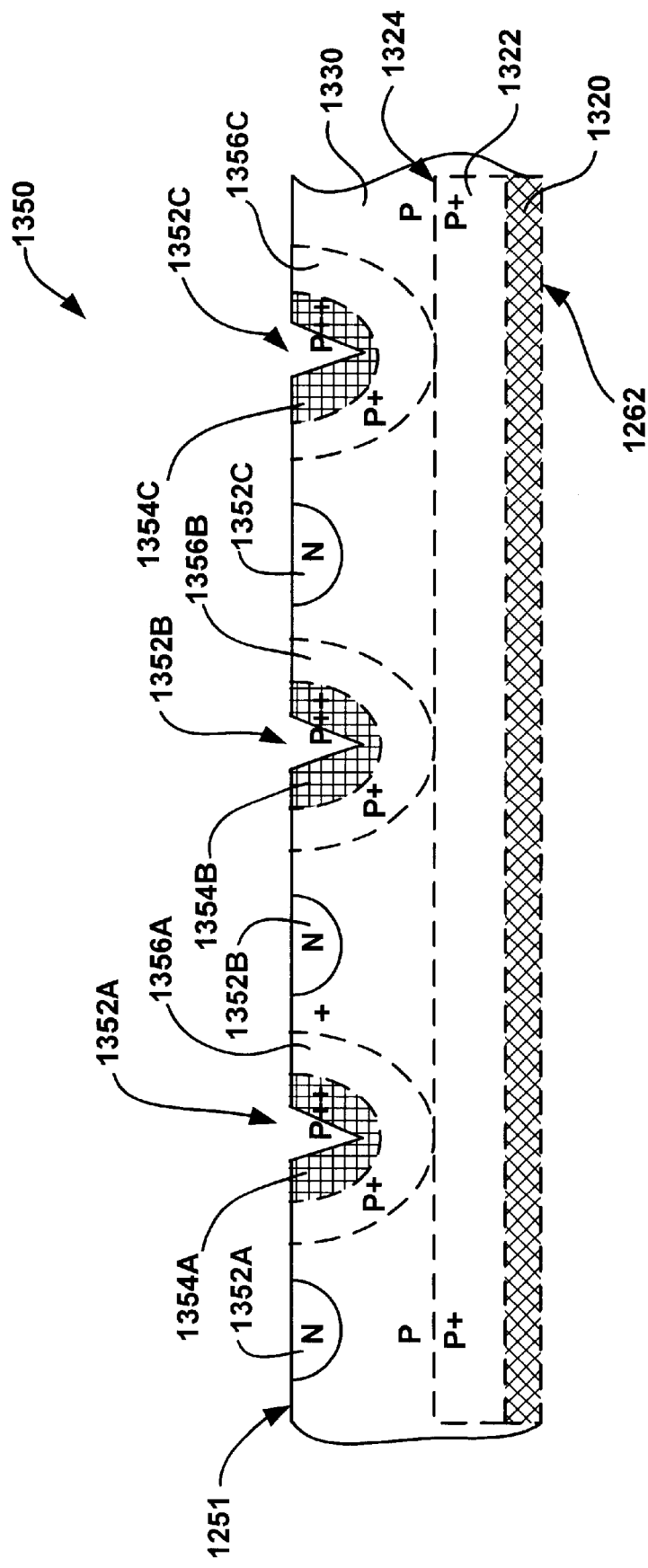
FIG. 14 is a cross-sectional diagram of an embodiment of a photodiode, according to another aspect of the present invention, where the surface diffusions are formed in trenches.

FIGS. 12, 13 and 14 are partial cross-sectional diagrams illustrating dopant concentrations in various embodiments of this aspect of the present invention. In the embodiments shown in FIGS. 12, 13 and 14, the substrate is shown as P type with N type collecting dots. However, the diode and techniques described can equally be applied to opposite polarity substrate and collecting dots. However, it is important to note that for the same dopant levels, a P substrate, as shown, tends to result in faster performance than a comparable N substrate because the minority electron carriers naturally diffuse faster than minority hole carriers.

In the embodiment of a photodiode 1250 shown in FIG. 12, dopant gradients 1256A, 1256B and 1256C result from top down diffusions from the collection dots 1252A, 1252B and 1252C. The substrate doping gradients on the surface 1251 of the dotted photodiode 1250 can be produced using standard silicon processing techniques by diffusing a dopant of the same polarity as the substrate at a site half way between the collecting diffusion dots 1252A, 1252B and 1252C. In the example of FIG. 12, a P substrate 1260 with N collecting dots 1252A, 1252B and 1252C would have a P+ dopant diffused along a semi-circle radius from a point half way between the N dots, as represented in cross-section by 1254A, 1254B and 1254C. Other configurations for the plurality of P+ diffusions 1254A, 1254B and 1254C may also be employed so long as the P+ diffusions are disposed substantially between the N collection dots 1252A, 1252B and 1252C. The electric field will be most negative where the P+ dopant is greatest, will decrease, and then gradually become positive as the P+ dopant concentration decreases. This field gradient, represented by areas 1256A, 1256B and 1256C in FIG. 12, will increase the diffusion rate of electrons from the region of highest negative electric field to the region of least negative or most positive electric field. Since the most negative field is at the furthest distance from the N dots 1252A, 1252B and 1252C, this has the effect of herding or increasing the diffusion rate of the photon generated electrons toward the collecting N dots 1252A, 1252B and 1252C.

In addition to creating a desirable field gradient, the surface diffusion of the same polarity as the substrate helps prevent surface polarity inversions that can degrade the performance of the dotted photodiode. These surface inversions act as isolated diodes which collect minority carrier charges, reducing the gain and bandwidth of the diode. These surface inversions are more likely to occur with a lightly doped substrate, which is desirable for the fastest carrier diffusion speeds. Thus, the surface diffusions 1254A, 1254B and 1254C indirectly improve speed by allowing use of extremely lightly doped substrates that would otherwise have problematic surface inversions.

FIG. 13 illustrates an embodiment of another photodiode 1300, according to this aspect of the present invention, that is formed by diffusing additional substrate doping 1320 from the backside surface 1261 of the dotted photodiode in order to produce a vertical doping gradient 1322. In FIG. 13, the backside diffusion 1320 creates a dopant gradient 1322 that results in a high dopant level at the light absorption depth 1324 for the photodiode 1300 to a lower dopant level at the surface 1301 of the photodiode. This gradient may be achieved using a substrate 1330 having a controllably thin thickness in order to minimize the dopant diffusion distance and the resulting field gradient 1322. Very thin wafer and backside processing may be achieved through use of a handling wafer in a process described in detail in U.S. Pat. No. 6,027,956 to Pierre Irrisou, herein incorporated by reference in its entirety for all purposes.

FIG. 14 shows yet another improved photodiode 1350, wherein the topside graded doping technique is used to diffuse dopants of the same polarity as the substrate into trenches 1352A, 1352B and 1352C between the collecting diffusion dots 1252A, 1252B and 1252C. By diffusing the dopant in trenches 1352A, 1352B and 1352C, the doping gradient can generate fields deeper into the substrate 1330, speeding minority carrier collection for carrier pairs generated deep within the silicon. Further speed performance improvement is obtained when this trench technique is combined with the bottom up vertical doping gradient illustrated in FIG. 13.

An alternative method that may be used to produce the vertical doping gradient of this aspect of the present invention is to grow an undoped epitaxial layer over a suitably doped substrate. The epitaxial silicon layer will pull dopant from the overgrown substrate in order to create a dopant gradient of highest level some distance below the start of the epitaxial layer and then decreasing upwards to the top of the epitaxial layer. In other words, the dopant will migrate from the substrate into the epitaxial silicon layer during processing in such a manner as to produce a dopant gradient that is strongest at the interface between the substrate and the epitaxial layer and gradually decreases as it reaches toward the top surface of the epitaxial layer. One of ordinary skill in the art will readily recognize that many fabrication techniques may be applied in order to obtain the doping gradient taught by the present invention.

The present invention is directed toward an improved process and structure for a high speed PN photodiode having a distributed photodiode structure. The PN dotted photodiode, according to the present invention, may be fabricated using low resolution lithography may have improved performance parameters of bandwidth, optical gain, and reduced capacitance.

Having illustrated and described the principles of the present invention in the context of the embodiments described above, it should be readily apparent to those skilled in the art that the invention can be modified in arrangement and detail without departing from such principles.

I claim:

1. A distributed photodiode, the photodiode comprising:
   a substrate, the substrate being doped with a first dopant type and having first and second planar surfaces;
   a first plurality of diffusions, the first plurality of diffusions being doped with a second dopant type and formed on the first planar surface of the substrate;
   a second plurality of diffusions, the second plurality of diffusions being doped with the first dopant type and formed on the first planar surface of the substrate interposed the first plurality of diffusions; and
   a first contact having a first plurality of connective traces disposed on the first planar surface of the substrate and coupled to each of the first plurality of diffusions.

2. The distributed photodiode of claim 1, further including a backside diffusion formed on the second planar surface of the substrate, the backside diffusion being doped with the first dopant type.

3. The distributed photodiode of claim 2, further including a plurality of trenches formed in the first planar surface of the substrate, where each of the second plurality of diffusions is formed on a wall of a corresponding one of the plurality of trenches.

4. The distributed photodiode of claim 1, further including a plurality of trenches formed in the first planar surface of the substrate, where each of the second plurality of diffusions is formed on a wall of a corresponding one of the plurality of trenches.

5. The distributed photodiode of claim 1, wherein each of the second plurality of diffusions further comprises a substantially circular diffusion disposed around a corresponding one of the first plurality of diffusions.

6. A distributed photodiode, the photodiode comprising:
   a substrate, the substrate being doped with a first dopant type and having first and second planar surfaces;
   a first plurality of diffusions, the first plurality of diffusions being doped with a second dopant type and formed on the first planar surface of the substrate;
   a backside diffusion formed on the second planar surface of the substrate, the backside diffusion being doped with the first dopant type; and
   a first contact having a first plurality of connective traces disposed on the first planar surface of the substrate and coupled to each of the first plurality of diffusions.

7. The distributed photodiode of claim 6, further including a second plurality of diffusions, the second plurality of diffusions being doped with the first dopant type and formed on the first planar surface of the substrate interposed the first plurality of diffusions.

8. The distributed photodiode of claim 7, further including a plurality of trenches formed in the first planar surface of the substrate, where each of the second plurality of diffusions is formed on a wall of a corresponding one of the plurality of trenches.

9. The distributed photodiode of claim 8, where each of the plurality of trenches is substantially circular surrounding a corresponding one of the first plurality of diffusions.

10. The distributed photodiode of claim 7, where each of the second plurality of diffusions is substantially circular surrounding a corresponding one of the first plurality of diffusions.

* * * * *